(12) United States Patent
Hochman

(10) Patent No.: US 9,877,406 B2
(45) Date of Patent: Jan. 23, 2018

(54) ARCHITECTURAL PANEL SYSTEM COMPOSED OF A COMBINATION OF SENSORY OUTPUT TILE MODULES AND NON-SENSORY-OUTPUT TILE MODULES, AND COMPONENTS THEREFOR

(71) Applicant: Revolution Display, LLC, Glendale, CA (US)

(72) Inventor: Jeremy Hochman, Walnut, CA (US)

(73) Assignee: Revolution Display, LLC, Glendale, CA (US)

( * ) Notice: Subject to any disclaimer, the term of this patent is extended or adjusted under 35 U.S.C. 154(b) by 0 days.

(21) Appl. No.: 15/429,042

(22) Filed: Feb. 9, 2017

(65) Prior Publication Data

US 2017/0359916 A1 Dec. 14, 2017

Related U.S. Application Data

(60) Provisional application No. 62/349,395, filed on Jun. 13, 2016.

(51) Int. Cl.
*G09F 9/302* (2006.01)
*H05K 7/14* (2006.01)
(Continued)

(52) U.S. Cl.
CPC ......... *H05K 7/1458* (2013.01); *H05K 7/1401* (2013.01); *H05K 7/1451* (2013.01);
(Continued)

(58) Field of Classification Search
CPC ........ G09F 9/3026; G06F 3/1446; G06F 3/16; F21S 2/005; F21V 33/006; F21V 21/02;
(Continued)

(56) References Cited

U.S. PATENT DOCUMENTS 4,263,736 A 4/1981 Beierwaltes et al.
4,591,949 A 5/1986 Lahr
(Continued)

FOREIGN PATENT DOCUMENTS

EP 2669881 A1 12/2013
JP 3046230 B2 5/2000
(Continued)

OTHER PUBLICATIONS

European Search Report dated Jun. 1, 2017, in connection with EP 17160072, filed Mar. 9, 2017.
(Continued)

*Primary Examiner* — James Wu
(74) *Attorney, Agent, or Firm* — Downs Rachlin Martin PLLC

(57) ABSTRACT

Architectural tiled panel systems composed of at least one sensory output tile module and a plurality of non-sensory-output tile modules. Each sensory output tile module includes any one or more of a variety of electronic devices, such as a video display device, an audio speaker, and an illumination device (e.g., an LED or light bulb), among others. Each non-sensory-output module includes a presentation face that is visually appealing. The non-sensory-output tile modules can be used to provide aesthetic surrounds for each of one or more sensory output tile modules and/or groups of sensory output tile modules. In some embodiments, a plurality of video display type sensory output tile modules are grouped together and controlled to provide a larger mosaicked video display. In some embodiments, abutting tile modules are secured together using connectors having a latch mechanism for each tile module connected thereby.

28 Claims, 18 Drawing Sheets

(51) Int. Cl.
*G06F 3/14* (2006.01)
*G06F 3/16* (2006.01)
*F21S 2/00* (2016.01)
*F21V 33/00* (2006.01)
*F21V 21/02* (2006.01)
*H04R 1/02* (2006.01)

(52) U.S. Cl.
CPC ............ H05K 7/1452 (2013.01); *F21S 2/005* (2013.01); *F21V 21/02* (2013.01); *F21V 33/006* (2013.01); *G06F 3/1446* (2013.01); *G06F 3/16* (2013.01); *G09F 9/3026* (2013.01); *H04R 1/028* (2013.01)

(58) Field of Classification Search
CPC ........... G09G 2300/026; H05K 7/1458; H05K 7/1401; H05K 7/1451; H05K 7/1452; H04R 1/028
See application file for complete search history.

(56) References Cited

U.S. PATENT DOCUMENTS

| | | | |
|---|---|---|---|
| 6,958,182 | B2 | 10/2005 | Hasecke et al. |
| 7,355,562 | B2 | 4/2008 | Schubert et al. |
| D581,380 | S | 11/2008 | Derocher et al. |
| D590,789 | S | 4/2009 | Pozin et al. |
| 7,607,793 | B2 | 10/2009 | Coushaine et al. |
| 8,136,277 | B2 | 3/2012 | Patterson et al. |
| 8,197,088 | B2 | 6/2012 | Patterson et al. |
| D672,168 | S | 12/2012 | Davis |
| 8,327,589 | B2 | 12/2012 | Sutton et al. |
| 8,485,689 | B2 | 7/2013 | Patterson et al. |
| 8,640,391 | B2 | 2/2014 | Newkirk et al. |
| 9,391,440 | B1 | 7/2016 | Gardner |
| 9,477,438 | B1 * | 10/2016 | Hochman ............... G09G 5/02 |
| 9,660,403 | B2 * | 5/2017 | Hochman ............ H01R 31/065 |
| 2005/0178034 | A1 | 8/2005 | Schubert et al. |
| 2005/0217201 | A1 | 10/2005 | Johnson et al. |
| 2007/0153502 | A1 | 7/2007 | Arriazu |
| 2008/0037284 | A1 | 2/2008 | Rudisill |
| 2008/0141572 | A1 * | 6/2008 | Tomich ..................... G09F 9/30 40/605 |
| 2008/0220632 | A1 | 9/2008 | Chang |
| 2008/0220655 | A1 | 9/2008 | Liao et al. |
| 2008/0280464 | A1 | 11/2008 | Hsu |
| 2009/0309494 | A1 | 12/2009 | Patterson et al. |
| 2010/0223857 | A1 * | 9/2010 | Sutton .................. A47B 46/005 52/27 |
| 2010/0284173 | A1 | 11/2010 | Verjans et al. |
| 2011/0023389 | A1 | 2/2011 | Myers |
| 2012/0038619 | A1 | 2/2012 | Shraga et al. |
| 2012/0159819 | A1 | 6/2012 | Patterson et al. |
| 2013/0181884 | A1 | 7/2013 | Perkins et al. |
| 2014/0110361 | A1 | 4/2014 | Newkirk et al. |
| 2014/0137384 | A1 | 5/2014 | Patterson et al. |
| 2015/0084837 | A1 * | 3/2015 | Mese .................... G06F 3/1446 345/1.3 |
| 2016/0014489 | A1 * | 1/2016 | Davis .................... H04R 1/026 381/333 |

FOREIGN PATENT DOCUMENTS

| | | |
|---|---|---|
| WO | 2009069076 A2 | 6/2009 |
| WO | 2014070684 A1 | 5/2014 |

OTHER PUBLICATIONS https://resin.io/blog/good-better-beast-week-3/ (Last viewed Jun. 20, 2016).
http://www.led-lightlink.com/4-2-1-led-video-floor.html/139030 (Last viewed on Jun. 20, 2016).
http://otssigns.net/blog/ (Last viewed on Jun. 20, 2016).
https://iceledscreens.wordpress.com/2013/06/11/building-your-massive-led-screen-strip-by-strip/ (Last viewed on Jun. 20, 2016).
https://www.christiedigital.com/en-us/digital-signage/products/microtiles (Last viewed on Jun. 20, 2016).
http://www.verypixel.com/service/LED_Display_Installation.html (Last viewed on Jun. 20, 2016).
http://www.ledinside.com/knowledge/2015/6/led_signage_industry_adapt_or_die (Last viewed on Jun. 20, 2016).
http://www.ergotron.com/ProductsDetails/tabid/65/PRDID/791/language/hi-IN/Default.aspx (Last viewed on Jun. 20, 2016).
http://www.audipack.com/products/rid/98959/prid/74238/pmame/flat_panel_video_wall_floor_stand_quick_release.html (Last viewed on Jun. 20, 2016).
http://www.bbslighting.com/products/area-48-led-detachable-barndoor-frame (Last viewed on Jun. 20, 2016).
https://web.archive.org/web/20160616231057/http://www.dgiled.com/product_show.asp?id=352&dasid=117&Immc=DGiLED+UHD+Tiles (Jun. 16, 2016).
https://web.archive.org/web/20151124042701/http://www.absen.com/pro/detail_101029001004_100000121043229.html (Nov. 24, 2015).

* cited by examiner

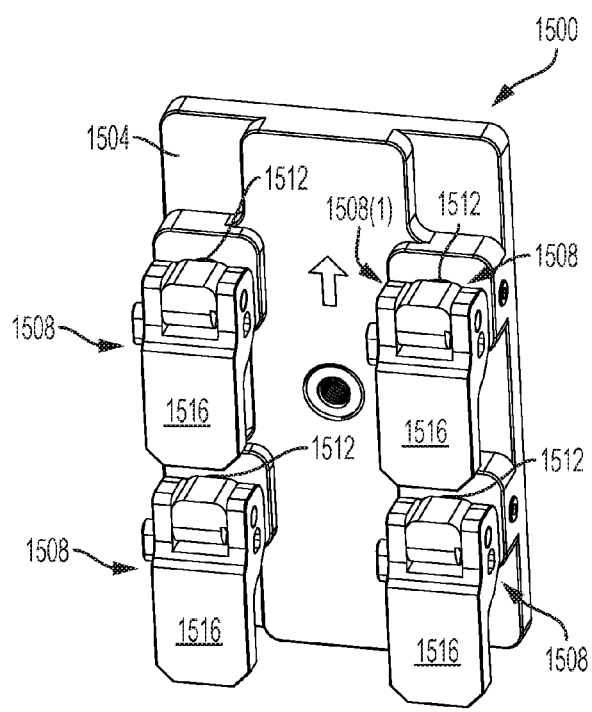
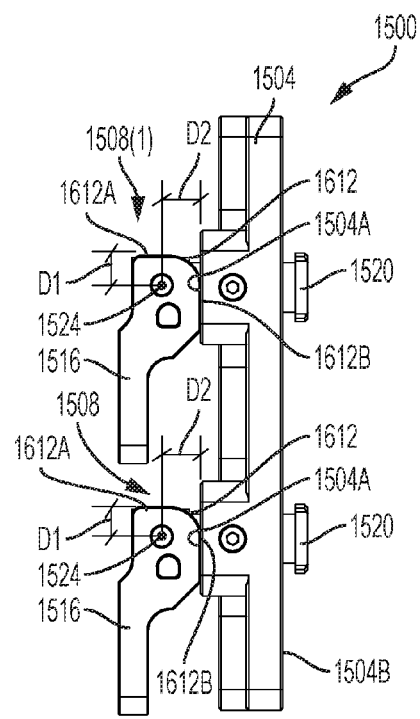
FIG. 15A FIG. 15B
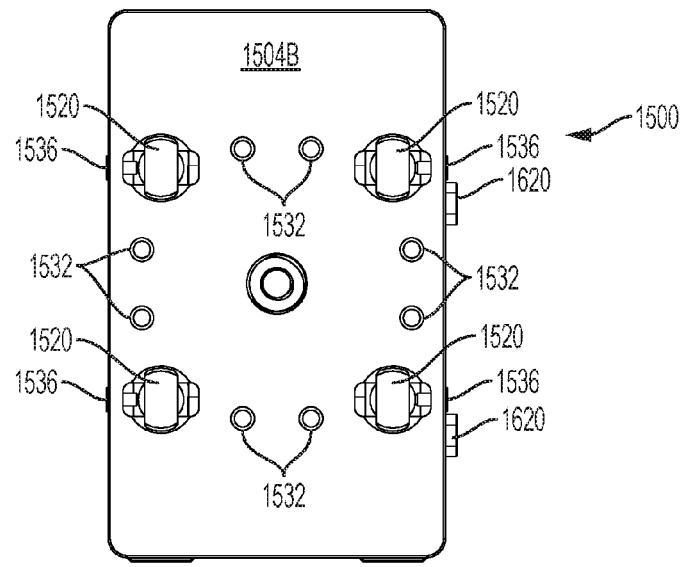
FIG. 15C

ARCHITECTURAL PANEL SYSTEM COMPOSED OF A COMBINATION OF SENSORY OUTPUT TILE MODULES AND NON-SENSORY-OUTPUT TILE MODULES, AND COMPONENTS THEREFOR

RELATED APPLICATION DATA

This application claims the benefit of priority of U.S. Provisional Patent Application Ser. No. 62/349,395, filed on Jun. 13, 2016, and titled "ARCHITECTURAL PANEL SYSTEM COMPOSED OF A COMBINATION OF ELECTRONICALLY ACTIVE AND INACTIVE TILE MODULES, AND COMPONENTS THEREFOR," which is incorporated by reference herein in its entirety.

FIELD OF THE INVENTION

The present invention generally relates to the field of architectural tiled panel systems. In particular, the present invention is directed to an architectural panel system composed of a combination of sensory output tile modules and non-sensory-output tile modules, and components therefor.

BACKGROUND

Lighting, video displays, and audio speakers are often incorporated into buildings and other structures where the aesthetics of the installations are important considerations. For example, some types of ceiling and wall lights are flush-mounted within recesses formed within the ceiling or wall, video displays are sometimes integrated into walls, and audio speakers are likewise sometimes flush mounted within recesses in ceilings or wall. All of these installations typically require modifications to conventional construction to accommodate these devices.

SUMMARY OF THE DISCLOSURE

In an implementation, the present disclosure is directed to an architectural tiled panel system that includes a support structure designed and configured to be secured to a base support; a plurality of sensory output tile modules coupled to the support structure; a plurality of non-sensory-output tile modules coupled to the support structure and located in abutting relation to ones of the plurality of sensory output tile modules so as to form an aesthetic surround for at least some of the plurality of sensory output tile modules; and an electrical network electrically connecting the sensory output tile modules to at least one driver for driving the sensory output tile modules, wherein at least one of the non-sensory-output tile modules includes at least one pass-through electrical conductor that forms part of the electrical network.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 15A is an enlarged perspective view of the obverse side of one embodiment of a 4-corner connector that can be used to securely connect individual tile modules to one another and/or to a support;

FIG. 15B is a side view of the 4-corner connector of FIG. 15A;

FIG. 15C is an elevational view of the reverse side of the 4-corner connector of FIGS. 15A and 15B;

DETAILED DESCRIPTION

Figure 1:
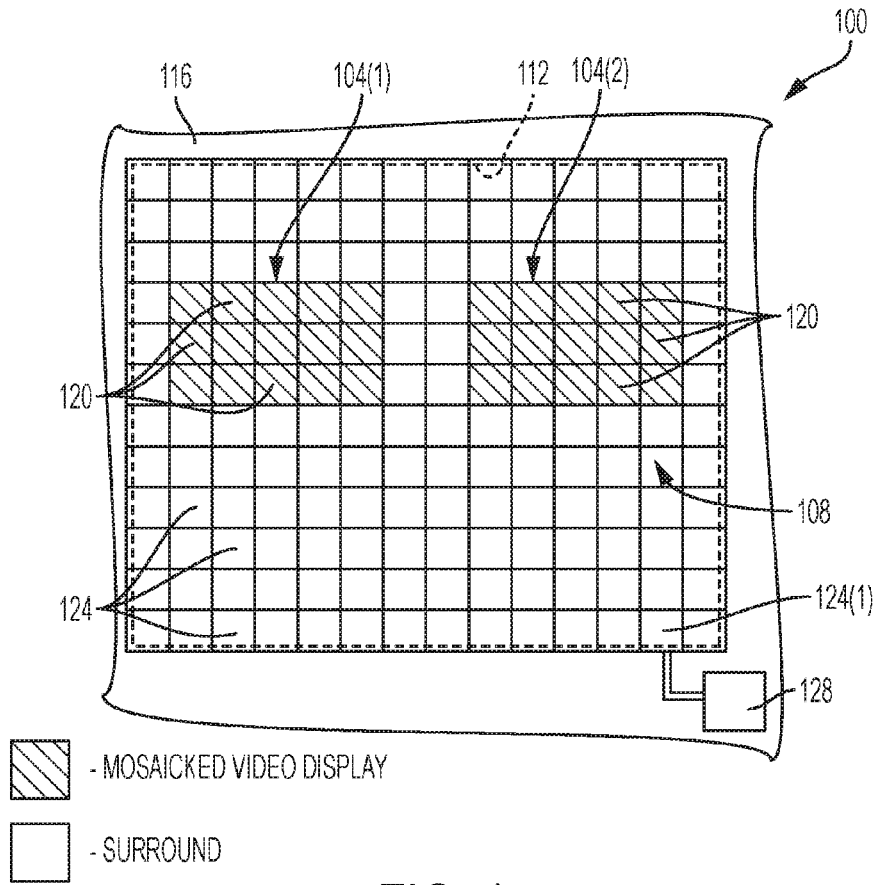
FIG. 1 is a front elevational view of an exemplary architectural tiled panel system that includes two mosaicked video displays composed of visual-type sensory output tile modules, and a uniform surround composed of non-sensory-output tile modules.

In some aspects, the present disclosure is directed to architectural tiled panel systems that include one or more sensory output tile modules and a plurality of non-sensory-output tile modules that form a unified presentation face that integrates electronic functionality(ies) with aesthetic appeal. Each "sensory output tile module" may be any of a wide variety of modules that generates a sensory output, for example, light and/or sound, for human sensory perception. Examples of a sensory output tile module include, but are not limited to, a video display module (e.g., LCD, LED, plasma, electronic paper, etc.), an individual video display tile of a mosaicked video display, a non-video light-emitting module (e.g., providing backlighting, ambient lighting, or light-display lighting), and a loudspeaker module, among others, and any suitable combination thereof, and that outputs such light and/or sound via a presentation face. In contrast, a "non-sensory-output tile module" is a tile module that does not provide any sensory output, i.e., does not actively (e.g., electronically) provide any output intended to stimulate any sense (e.g., sight, hearing, etc.) of a person within range of the architectural tiled panel system and is typically provided with an aesthetically appealing front, or "presentation," face selected, for example, to provide a surround for the sensory output tile module(s) and/or to otherwise provide one or more visually appealing non-sensory-output regions on a panel composed of sensory output and non-sensory-output tile modules. The presentation face of each non-sensory-output tile module can be made of any suitable material, such as natural stone (e.g., thin-shaved marble, granite, slate, etc.), wood, polymer, composite, textile (e.g., stretched on a frame or bonded to a substrate, woven or nonwoven), paper, carpeting, stucco, plaster (textured or untextured), paint, among many others, and any combination thereof. Fundamentally, there is no limitation on the type(s) and nature(s) of the material(s) used for the presentation face of a non-sensory-output tile module.

It is noted that in some examples the fact that a non-sensory-output tile module does not provide any intentional sensory output does not mean that it does not contain one or more electronic or electrical components. While some or all non-sensory-output tile modules in some architectural tiled panel systems of the present disclosure may not have any electronic or electrical components, in other architectural tiled panel systems of the present disclosure one or more of the non-sensory-output tile modules include electrical and/or electronic components. For example, in some embodiments, the architectural tiled panel system may be configured so that one or more non-sensory-output tile modules pass power, data signals, and/or driver signals to the one or more sensory output tile modules. In such cases, each or each of a select one or more of the non-sensory-output tile modules includes one or more pass-through electrical conductors that carry such power, data, and/or driver signals. As another example, in some embodiments, the architectural tiled panel system may be configured so that one or more non-sensory-output tile modules not only pass power, data signals, and/or driver signals but also have onboard electronics for supporting one or more of the sensory output tile modules. Such onboard electronics may include, but not be limited to, power supplies, video drivers, audio drivers, and electronic ballasts, among other things.

In some embodiments, pass-through electrical conductors in a non-sensory-output tile module may enable serial and/or parallel communications to and/or between one or more sensory output tile modules. In some embodiments, such communications may include addressing, tags, channels, or other formatting or information operable to specify a particular sensory tile and/or a location of a sensory tile. For example, such communications may command a particular sensory tile to display a logo regardless of the position of that tile within an array of tiles. On the other hand, such communications may additionally or alternatively command a sensory tile in a particular position within an array of tiles to display a logo such that any sensory tile in that position will display the logo but would cease to display that logo if moved from that particular position to another position within the array. Communications may be provided by a controller to all tiles simultaneously, such as via a modulated signal and/or a set of channels, such that each tile analyzes or filters the communications to identify commands and/or other information intended for its use. Additionally or alternatively, communications may be provided by a controller to specific tiles such that when a tile receives a command or information intended for another tile, it passes the communications to another tile. In some embodiments, a controller and/or one or more tiles may be aware of the positions of tiles such that communications for a particular sensory tile can be routed to that tile in an efficient manner, e.g., without necessarily having to pass through each of the other tiles in an array before reaching the intended tile. Such positional awareness may be enabled by including one or more gyroscopes and/or other sensors in the tiles; further, in some embodiments, positional awareness of tiles may be implemented by assigning identifiers to each tile and having each tile query or otherwise obtain the identifiers for tiles located above, to the right, to the left, and/or below its position and communicate that information to a controller and/or other tiles. In some embodiments, where a controller or tile is aware of its own position within and/or the location of its connection to an array of tiles, a controller or tile may issue a command to all sensory tiles, optionally as well as non-sensory tiles, simultaneously requesting immediate acknowledgement of receipt of the command. The controller or tile may then determine the positions of other tiles as a function of the various delays between issuing the command and receiving responses, which may include one or more identifiers and/or timestamps and may indicate when the command was received and/or when a response was transmitted, from individual tiles.

In some embodiments, a controller and/or one or more tiles may execute a topological and/or other algorithm in order to determine the fastest route through which a command for a particular tile can be routed to that tile and then provide a definition of that route along with the command such that each tile receiving a communication originating from the controller identifies the next tile in the route and passes the command on to the next tile in accordance with that route. In some embodiments, pass-through electrical conductors in a non-sensory-output tile module may be specific to a particular arrangement of tiles in an array (e.g., an upper-right corner non-sensory-output tile in an array may contain just one pass-through electrical conductor or set of pass-through electrical conductors enabling communications to pass from a tile beneath it in the array to communicate with a tile to its left in the array, as no tiles will be located above or to the right of the upper-right corner tile) or may be generic such that the tiles can adapt to any arrangement (e.g., one or more pass-through electrical conductors allowing any tile attached to a non-sensory-output tile to communicate with any other tile attached to the non-sensory-output tile). In some embodiments, sensory output tiles may also contain one or more sets of pass-through electrical conductors.

When a non-sensory-output tile module does not include any electronic or electrical component, it may simply be composed of the material(s) that provide the presentation face of the tile module and means for securing the material(s) to a support structure. Depending on the presentation-face material(s), the nature of the support structure, and the configuration of the sensory output tile modules, such a non-sensory-output tile module may include a frame and/or substrate and/or other component(s) for supporting the presentation-face material(s) and/or for securing such material(s) to the support structure. In embodiments in which all of the non-sensory-output tile modules do not include electronic or electrical components, power, data, and/or driver signals may be routed to sensory output modules via any suitable means, such as direct cabling from power and/or driver electronics, daisy-chain cabling, wireless data signaling, etc. Those skilled in the art will understand appropriate power and communications systems for any particular installation, which may depend on local requirements. A variety of examples of differing architectural tiled panel systems and exemplary installations are illustrated in the appended drawings and described below.

In some applications, an architectural tiled panel system can be incorporated into a building as an architectural feature or as a feature separate from architectural elements of a building, such as part of a freestanding structure or a media display. Some of these implementations are illustrated in the following examples, which are also provided to illustrate exemplary support structures, electrical connections, and means for attaching the tile modules to the support structures. Regarding architectural elements, examples of uses for architectural tiled panel systems made in accordance with the present invention include, but are not limited to a facing for entire walls, a facing for entire ceilings, a facing for a portion of a wall (may be made flush with or proud of adjacent portion(s) of the wall), facings for portions of ceilings (may be made flush with or proud of adjacent portion(s) of the ceiling), an accent feature secured to a wall or ceiling, and an accent feature secured to another structure that is considered part of the building. With these generalities in mind, following are some specific exemplary installations of architectural tiled panel systems that can be made in accordance with the present invention. Those skilled in the art, however, will readily recognize that these examples are but a very few of the many installations that can be made using the fundamental features disclosed herein. Those skilled in the art will also readily appreciate that the possible instantiations of an architectural tiled panel system made in accordance with the present disclosure are virtually limitless due in part to the many variables that a designer can control, including, but not limited to: 1) the size(s) and shape(s) of the presentation faces of the individual tile modules; 2) the wide selection of presentation face materials for the non-sensory-output tile modules; 3) the wide selection for the colors of the presentation faces of the non-sensory-output tile modules; 4) the variety of ways in which the sensory output tile modules can be electrically connected to their activating electronics and/or each other; 5) the variety of support structures that can be used; 6) the variety of means that can be used to secure tile modules to a support structure; 7) the variety of types of sensory output tile modules that can be used; and 8) the virtually limitless ways in which sensory output and non-sensory-output tile modules can be arranged to create different visual effects, among others. Consequently, the following examples only scratch the surface of the flexibility and usefulness of architectural tiled panel systems made in accordance with the present disclosure.

Turning now to the drawings, FIG. 1 illustrates an exemplary architectural tiled panel system 100 that includes two mosaicked video displays 104(1) and 104(2) and a uniformly colored and textured surround 108, all supported by an underlying support structure 112, which in this case is secured to a base structure 116, such as a building wall. In this example, each mosaicked video display 104(1) and 104(2) is composed of 15 like sensory output tile modules 120, each of which has a 10 in.×10 in. presentation face and the surround is composed of 138 like non-sensory-output tile modules 124 (only some of which are labeled for convenience) each of which also has a 10 in.×10 in. presentation face. Each tile module 120 and 124 and underlying support structure 112 are configured so that they abut one another with precision such that from a reasonable viewing distance each of mosaicked video displays 104(1) and 104(2) and textured surround 108 appear virtually seamless. In this example, each sensory output tile module 120 includes an LCD video display panel and associated electronics (not shown) and each non-sensory-output tile module 124 has a presentation face made of a veneer of natural slate. Support structure 112 in this example is a flat piece of ferromagnetic material, and each tile module 120 and 124 is secured to the support structure via magnets mounted on the backsides of the tile modules. Also in this particular example, all tile modules 120 and 124 are electrically connected together using electrical connector biscuits (not shown in FIG. 1) that are the same as or similar to the electrical connector biscuits shown and described in U.S. Pat. No. 9,477,438 titled "DEVICES FOR CREATING MOSAICKED DISPLAY SYSTEMS, AND DISPLAY MOSAIC SYSTEMS COMPRISING SAME" and issued on Oct. 25, 2016, in the names of Hochman et al. ("the '438 patent"), which is incorporated by reference herein for all of its disclosure pertinent to the present disclosure, including, but not limited to, its teachings on tile modules, electrical connector biscuits, support structures, driver electronics, and connections between driver electronics and tile modules and as addressed hereinbelow. Correspondingly, each tile module 120 and 124 includes four recessed electrical receptacles the same as or similar to recessed electrical receptacles of the '438 patent that allow the tile modules to be installed and removed in a direction perpendicular to the plane of support structure.

All non-sensory-output tile modules 124 in this example are identical in construction, and each includes pass-through wiring and any necessary electronics for passing power and video driver signals to sensory output tiles 120 that make up mosaicked video displays 104(1) and 104(2). In this connection, architectural tiled panel system 100 also includes a power and video driver module 128 that provides power and video signals to sensory output tiles 120. In this example, power and video driver module 128 is connected to one of non-sensory-output tile modules 124(1) via an electrical connector biscuit (not shown) that electrically couples to one of the recessed electrical receptacles (not shown) on that non-sensory-output tile module. A similar arrangement can be seen in FIG. 4 of the '438 patent. It is noted that in this installation illustrated in FIG. 1 of the present application, and in any other installation of an architectural tiled panel system of the present disclosure, the architectural tiled panel formed by the tile modules need not be planar. Rather, it may be curved in one or more directions (e.g., see FIG. 4 of the '438 patent), "bent"/"folded" (e.g., like a bellows), or any other shape, depending, for example, on the contour of the base structure or the support structure.

Figure 2:
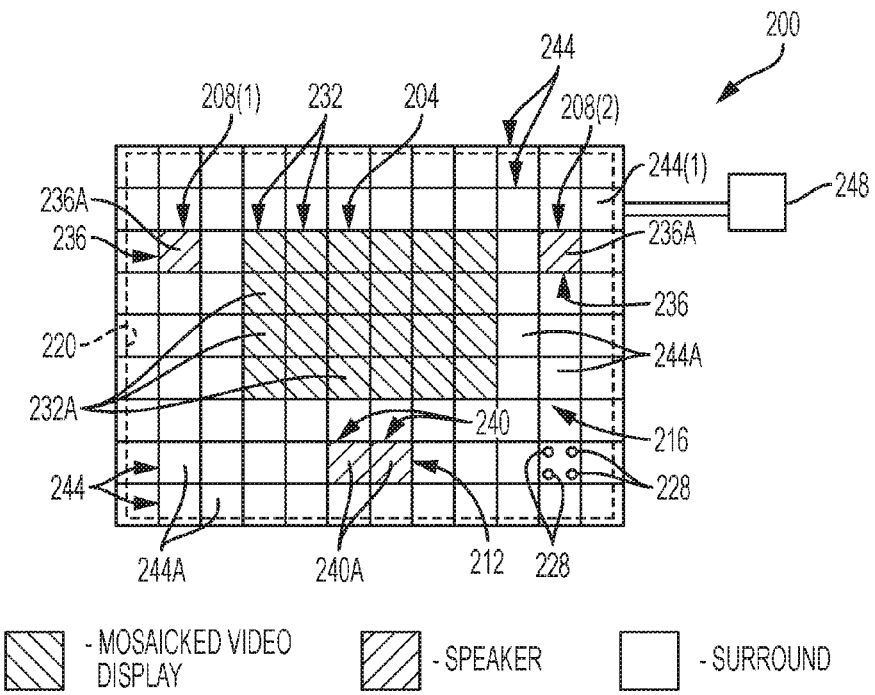
FIG. 2 is a front elevational view of an exemplary architectural tiled panel system that includes a mosaicked video display and audio speakers composed of, respectively, visual-type and aural-type sensory output tile modules, and a uniform surround composed of non-sensory-output tile modules.

FIG. 2 illustrates an exemplary tiled panel system 200 that includes a single mosaicked video display 204, a pair of stereo speakers 208(1) and 208(2), a subwoofer speaker 212, and a uniformly colored and textured surround 216, all supported by an underlying support structure 220, which in this case comprises a metal sheet having a regular pattern of holes 228 (only a few shown where a tile module has been removed for illustration) that receive corresponding snap-in-place studs (not shown) on the backsides of the tile modules 232, 236, 240, and 244, that compose the tiled panel system. In this example: tile modules 232 are video display type sensory output tile modules each having a bezel-less LCD video display 232A as the presentation face; tile modules 236 are stereo speaker type sensory output tile modules each containing one or more mid-range and/or tweeter speakers (not shown) and having an acoustically transparent covering 236A; tile modules 240 are speaker type sensory output tile modules each containing one or more woofer speakers (not shown) and having an acoustically transparent covering 240A; and tile modules 244 are non-sensory-type tile modules provided for making surround 216 aesthetically appealing. In the present example, each non-sensory-type tile module 244 includes a wood veneer 244A for its presentation face. Acoustically transparent coverings 236A and 240A of speaker type sensory output tile modules 236 and 240 may be selected to match with, contrast with, or blend with wood veneers 244A.

Each tile module 232, 236, 240, and 244 as well as underlying support structure 220 are configured so that they abut one another with precision such that from a reasonable viewing distance each of mosaicked video displays 204, speakers 208(1), 208(2), and 212 and textured surround 216 appear virtually seamless. Also in this particular example, all tile modules 232, 236, 240, and 244 are electrically connected together using electrical connector biscuits (not shown in FIG. 2) that are the same as or similar to the electrical connector biscuits shown and described in the '438 patent. Correspondingly, each tile module 232, 236, 240, and 244 includes four recessed electrical receptacles the same as or similar to recessed electrical receptacles of the '438 patent that allow the tile modules to be installed and removed in a direction perpendicular to the plane of support structure. All non-sensory-output tile modules 244 in this example are identical in construction, and each includes pass-through wiring and any necessary electronics for passing power, video signals, and audio signals to sensory output tile modules 232, 236, 240 that make up mosaicked video display 204 and speakers 208(1), 208(2) and 212. In this connection, architectural tiled panel system 200 also includes a power, video driver, and audio driver module 248 that provides power and video and audio signals to sensory output tile modules 232, 236, and 240. In this example, power, video driver, and audio driver module 248 is connected to one of non-sensory-output tile modules 244(1) via an electrical connector biscuit (not shown) that electrically couples to one of the recessed electrical receptacles (not shown) on that non-sensory-output tile module. A similar arrangement can be seen in FIG. 4 of the '438 patent.

Figure 3:
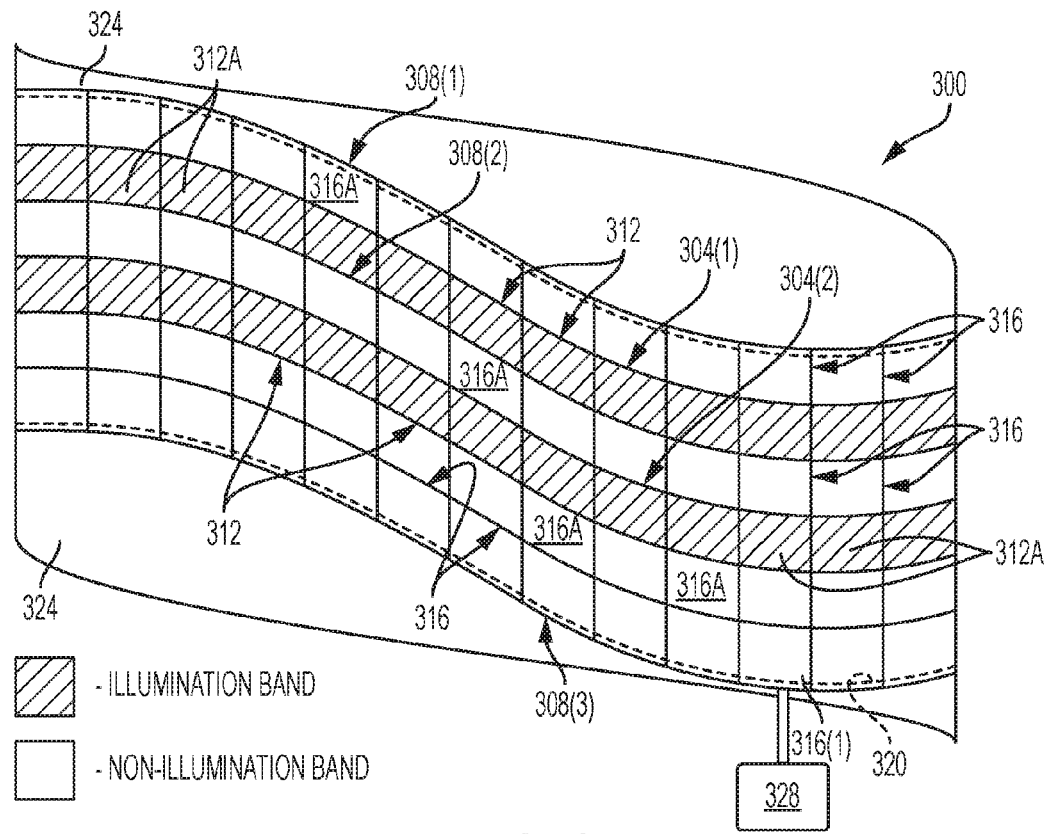
FIG. 3 is a front elevational view of an exemplary architectural tiled panel system that includes a pair of illumination bands composed of visual-type sensory output tile modules, and a set of non-illumination bands composed of non-sensory-output tile modules.

FIG. 3 illustrates a portion of exemplary tiled panel system 300 that includes two illumination bands 304(1) and 304(2) interdigitated with three non-illumination bands 308(1) to 308(3). One can envision tiled panel system 300 applied to a long wall, such as, for example, the wall of a long encircling corridor of a large stadium or similar structure. In this example, illumination bands 304(1) and 304(2) are composed of light-emitting sensory output tile modules 312 and non-illumination bands 308(1) to 308(3) are composed of non-sensory-output tile modules 316. Light-emitting sensory output tile modules 312 are identical relative to one another in terms of their presentation-face light emitting elements 312A and fundamental construction, but differ from one another in terms of shape so as to accommodate the curvature of illumination bands 304(1) and 304(2). Each light-emitting element 312A may be any suitable light-emitting element, such as a translucent colored lens backlit by one or more lighting devices (LED(s), bulb(s), etc.), a translucent white lens backlit by a set of lighting devices that allow the light-emitting element to change color in response to an appropriate drive signal, and an array of LEDs (single color, multicolor, addressable to change colors and/or patterns, etc.). In one particular example, one, the other, or both illumination bands 304(1) and 304(2) can be controlled to display words and/or symbols and/or shapes in a static and/or moving manner, for example to provide information and/or visual interest to viewers. In this embodiment, non-sensory-output tile modules 316 may provide a unified color and/or texture in each non-illumination band 308(1) to 308(3) and the color and/or texture may be the same among all of the non-illumination bands or differ from one non-illumination band to the next. As in other embodiments, the material(s) used for the presentation face 316A of each non-sensory-output tile module may be any suitable material(s). In this example, all of sensory output and non-sensory-output tile modules 312 and 316 are magnetically secured to an underlying ferromagnetic support structure 320, which in turn may be attached to a base support 324, such as a wall of a building, among others. Such magnetic mounting may be effected in the same or similar manner as the manner disclosed in the '438 patent.

Each sensory output and non-sensory-output tile module 312, 316 as well as underlying support structure 320 are configured so that the tile modules abut one another with precision such that from a reasonable viewing distance each of illumination bands 304(1) and 304(2) and non-illumination bands 308(1) to 308(3) appear virtually seamless. Also in this particular example, all sensory output and non-sensory-output tile modules 312 and 316 are electrically connected together using electrical connector biscuits (not shown in FIG. 3) that are the same as or similar to the electrical connector biscuits shown and described in the '438 patent. Correspondingly, each sensory output and non-sensory-output tile module 312 and 316 includes four recessed electrical receptacles the same as or similar to recessed electrical receptacles of the '438 patent that allow the tile modules to be installed and removed in a direction perpendicular to the plane of support structure 320. All non-sensory-output tile modules 316 in this example are identical in construction, and each includes pass-through wiring and any necessary electronics for passing power, video signals, and audio signals to sensory output tile modules 312 that make up illumination bands 304(1) and 304(2). In this connection, architectural tiled panel system 300 also includes a power and/or graphics driver module 328 that provides power and/or graphic control signals to sensory output tiles 312. In this example, power and/or graphics driver module 328 is connected to one of non-sensory-output tile modules 316(1) via an electrical connector biscuit (not shown) that electrically couples to one of the recessed electrical receptacles (not shown) on that non-sensory-output tile module. A similar arrangement can be seen in FIG. 4 of the '438 patent.

Figure 4:
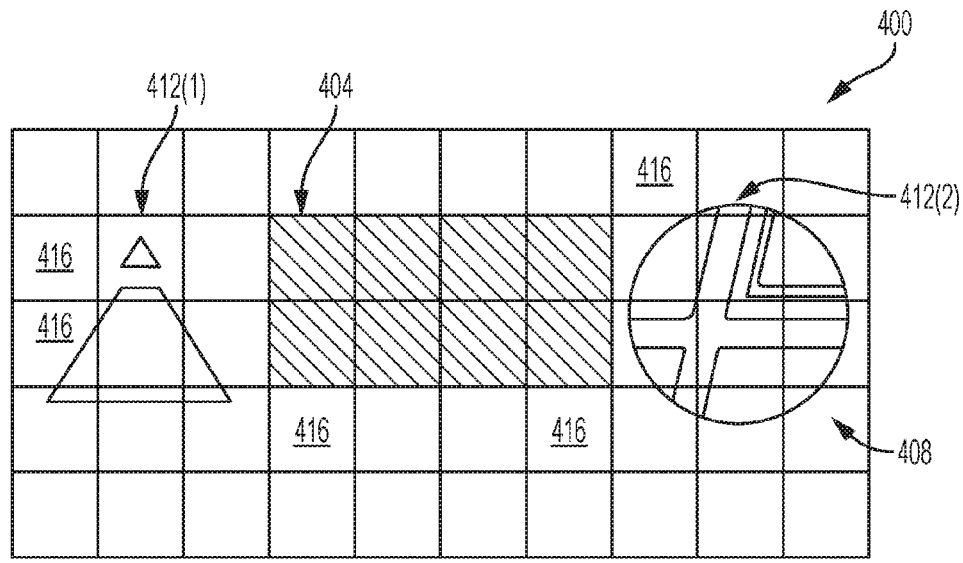
FIG. 4 is a front elevational view of an exemplary architectural tiled panel system that includes a mosaicked video display composed of visual-type sensory output tile modules, and a surround that includes static graphics and is composed of non-sensory-output tile modules.

FIG. 4 illustrates an exemplary tiled panel system 400 that includes a mosaicked video display 404 and an expansive surround 408, which in this example is augmented with graphics, here static graphics 412(1) and 412(2) on either side of the mosaicked video display. Tiled panel system 400 may have the same or similar construction of tiled panel system 100 of FIG. 1, except that in tiled panel system 400 of FIG. 4, certain ones of the non-sensory-output tile modules 416 have static graphics 412(1) and 412(2) permanently applied to them. Each static graphic 412(1) and 412(2) can be applied in any suitable manner, such as via silk screening, painting, decal, etc. Typically, though not necessarily, each individual non-sensory-output tile module 416 having a portion of one or the other of static graphics 412(1) and 412(2) will have that portion pre-applied prior to installation. However, each static graphic 412(1) and 412(2) can be applied after non-sensory-output tile modules 416 have been installed. Installations of tiled panel systems similar to tiled panel system 400 of FIG. 4 may be particularly suited, for example, for application in retail sales spaces where the tiled panel system can be applied to an entire wall of a building or a large portion thereof. In such case, each static graphic 412(1) and 412(2) may be or may include a company logo and/or a graphic relating to goods sold by the retailer. For example, if the retailer sells athletic gear, each static graphic 412(1) and 412(2) may be a large photo or silk screening of a person in action in a particular sport while wearing the retailer's athletic gear. Those skilled in the art will readily appreciate that while only a single mosaicked video display 404 and two static graphics 412(1) and 412(2) are illustrated, any number of video displays and graphics may be used. Of course, other arrangements of video displays and graphics can be used, too.

Figure 5:
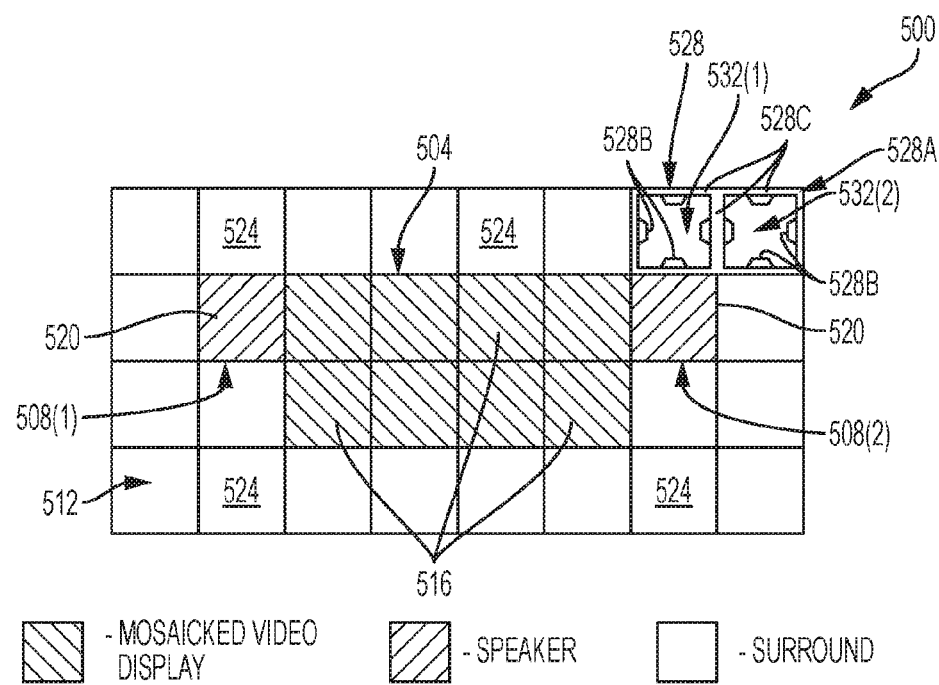
FIG. 5 is a front elevational view of an exemplary architectural tiled panel system that includes a mosaicked video display, audio speakers, and a surround, in which the sensory output tile modules and non-sensory-output tile modules that compose these components are supported by a frame-type support structure.

FIG. 5 illustrates an exemplary tiled panel system 500 having a single mosaicked video display 504, a pair of stereo speakers 508(1) and 508(2), and a surround 512. Each of these components may be composed of sensory output and non-sensory-output tile modules 516, 520, and 524 that are the same as or similar sensory output and non-sensory-output tile modules of other tiled panel systems described above, such as tile modules 120, 124, 232, 236, 240, 244 and 416 of tiled panel systems 100, 200, and 400 described above in connection with FIGS. 1, 2, and 4, respectively. A difference between tiled panel system 500 of FIG. 5 and tiled panel systems 100, 200, and 400 of FIGS. 1, 2, and 4 is the nature of the support structure 528 supporting sensory-output and non-sensory-output tile modules 516, 520, and 524.

As seen at tile-module receivers 532(1) and 532(2) where no tile modules are yet present, support structure 528 comprises a frame 528A (rather than a sheet-type substrate), with electrical connectors 528B engaged with the frame. Electrical connectors 528B may be the same as or similar to the electrical connector biscuits described above for other embodiments and described in more detail in the '438 patent. This allows tile modules 516, 520, and 524, which have recessed receptacles (not shown) designed to conformally and snugly receive electrical connectors 528B, to be installed and removed from support structure 528 in a direction perpendicular to the support structure. Electrical connectors 528B may be monolithically integrated with frame 528A or they may be formed separately and secured to the frame via any suitable means. If electrical connectors 528B are monolithically formed with frame 528A, wiring for the electrical connectors may be contained within and run along the vertical and horizontal frame members 528C to one or more external connection points on the frame. In this manner, electrical connectors 528B are not simply passing power and/or signals through to abutting tile modules; rather, the power and/or signal paths are essentially through vertical and horizontal frame members 528C. Alternatively, electrical connectors 528B may simply be pass-through connectors that pass power and/or signals from one abutting tile module to the next. In some embodiments, frame 528A may be made of a polymer or composite material to decrease its weight over a solid sheet of metal. However, frame 528A may indeed be made of metal and/or other materials as well. In some embodiments, frame 528A itself may be architectural. For example and in terms of tile-module receivers (e.g., tile-module receivers 532(1) and 532(2)), a frame module may, for example, be 4×1, 2×2, 4×4, 2×4, etc., with each frame module designed to be coupled with another frame module along each of its lateral sides.

Figure 6A:
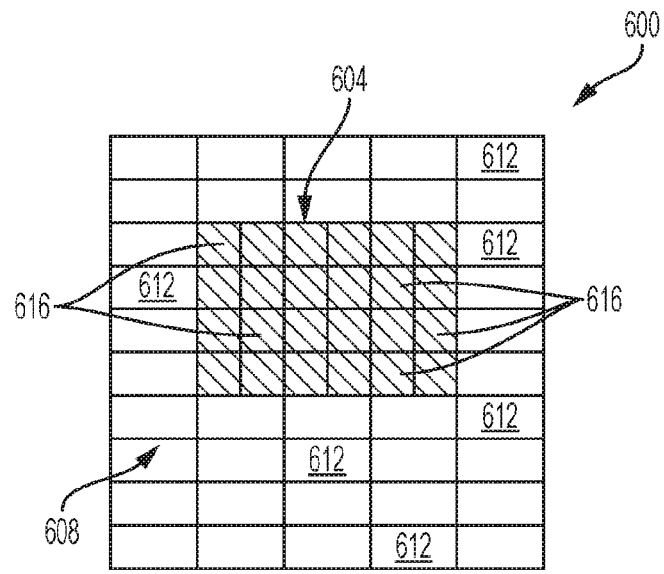
FIGS. 6A and 6B are front elevational views of a pair of exemplary architectural tiled panel systems in which the non-sensory-output tile modules differ in size relative to the sensory output tile modules.
Figure 6B:
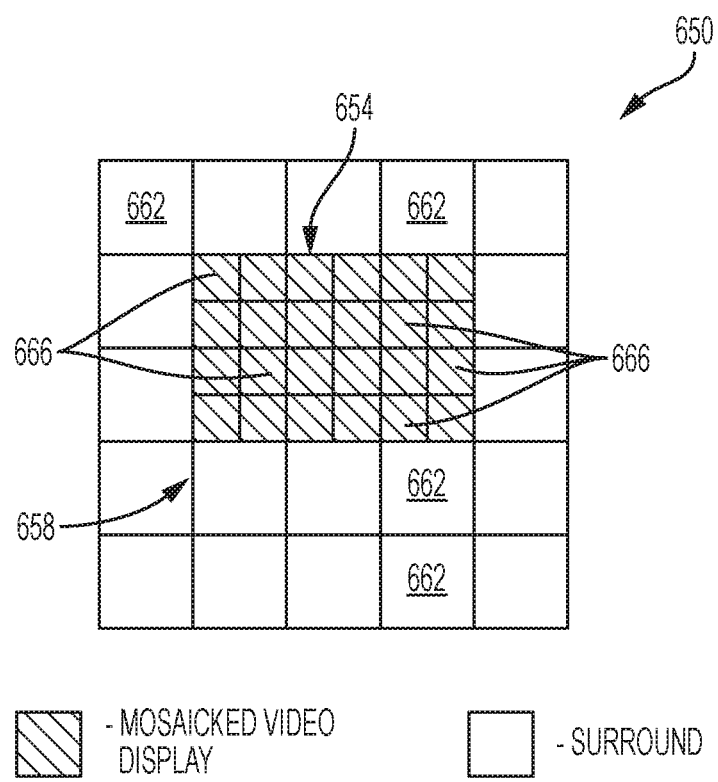

FIGS. 6A and 6B illustrate that not all of the tile modules in any particular architectural tiled panel system of the present disclosure need to be the same size. FIG. 6A illustrates a simple architectural tiled panel system 600 having a mosaicked video display 604 and a surround 608 in which each non-sensory-output tile module 612 making up the surround is essentially twice as wide (or long) as each sensory output tile module 616 of the mosaicked video display. FIG. 6B illustrates another simple architectural tiled panel system 650 also having a mosaicked video display 654 and a surround 658 in which each non-sensory-output tile module 662 making up the surround is essentially twice as wide and twice as long as each sensory output tile module 666 of the mosaicked video display. Providing larger non-sensory-output tile modules for surrounds can allow for quicker assembly of the surrounds, which can be beneficial in installations where the surrounds are relatively large. These larger non-sensory-output tile modules 612 and 662 are merely illustrative, and other sizes are possible. It is noted, however, that the situation can be reversed. That is, the size of the sensory output tile modules can be larger than the non-sensory-output tile modules. Also, multiple sizes of each type of tile module can be used in a single architectural tiled panel installation. All other aspects of non-sensory-output tile modules 612 and 662 of FIGS. 6A and 6B may be the same as or similar to other embodiments disclosed herein. For example, when electrical connector biscuits or similar structures are used, for non-sensory-output tile modules 612 of FIG. 6A the longer sides of each of these modules may have two recessed connector receptacles to match up to two of the smaller sensory output tile modules 616. Likewise, when electrical connector biscuits or similar structures are used, each of the four lateral sides of non-sensory-output tile module 662 of FIG. 6B may have two recessed connector receptacles to match up to two of the smaller sensory output tile modules 666.

Figure 7A:
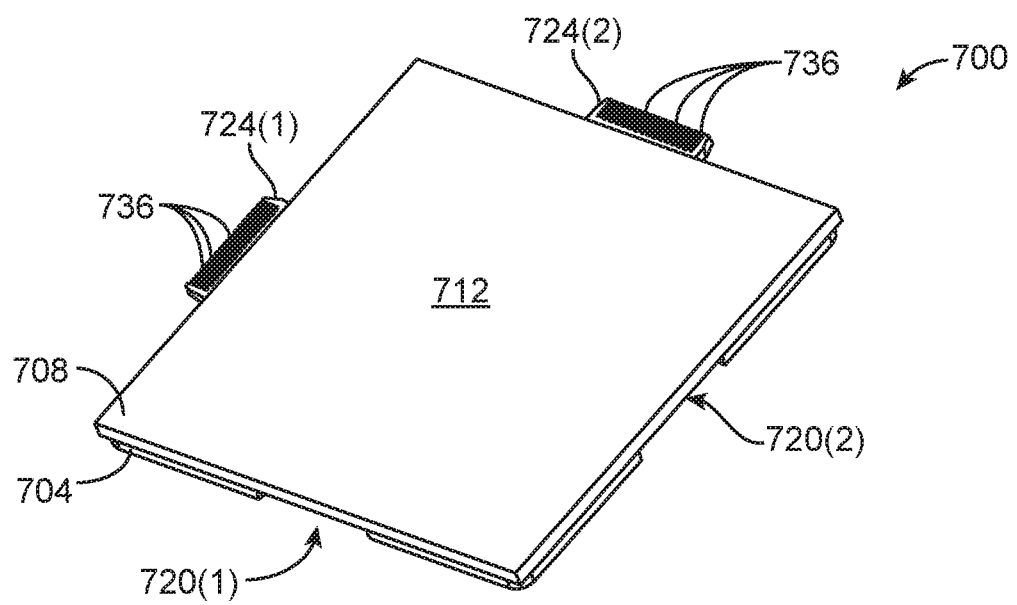
FIG. 7A is an isometric view of an exemplary tile module made in accordance with the present disclosure, showing the front face of the tile and two connector biscuits engaged with the two recessed receptacles.
Figure 7B:
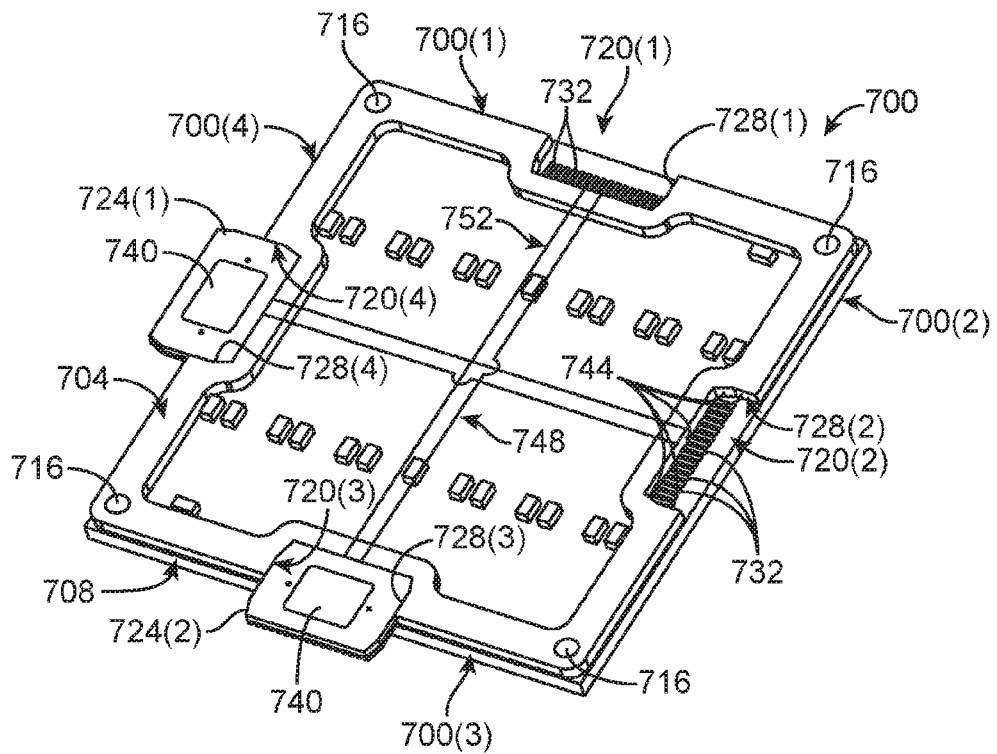
FIG. 7B is an enlarged isometric/diagrammatic view of the tile module of FIG. 1A, showing the rear face of the tile and the two connector biscuits engaged with the two recessed receptacles and diagrammatically illustrating an exemplary arrangement of data and power connections when the tile module is a non-sensory-output tile.

Referring now to the drawings, FIGS. 7A and 7B illustrate a tile module 700, which can be either a sensory output tile module or a non-sensory-output tile module. In this example, tile module 700 includes a backing portion 704 and a front portion 708. Front portion 708 may be active so as to provide sensory output, such as light or sound, in any manner described elsewhere in this disclosure. Alternatively, front portion 708 may be passive, such as by providing an architectural presentation face, as described elsewhere herein. When front portion 708 is active or tile module 700 otherwise includes active electronics, backing portion 704 may be made of a material having a relatively high thermal conductivity to allow it to function as a heat sink for front portion 708 and/or any other onboard electronics.

FIG. 7A primarily shows the front face 712 of tile module 700, which is the presentation face that a viewer sees when viewing the architectural tiled panel system of which tile module 700 would be part of when deployed. In this example, tile module 700 is a magnetically mountable module, and the magnetic mounting is effected by a set of permanent magnets 716 fixed to back portion 704 (FIG. 7B). As those skilled in the art will readily appreciate, any of a variety of discrete permanent magnets can be used for permanent magnets 716. Not shown in FIGS. 7A and 7B but able to be readily envisioned, is a ferromagnetic support structure, such as a non-magnetized ferromagnetic metal sheet or metal lattice, to which permanent magnets 716 are attracted when the tile module is deployed in an architectural tiled panel system.

FIG. 7B shows that in this example tile module 700 has four recessed receptacles 720(1) to 720(4), one centered on each of the four peripheral edges 700(1) to 700(4) of the tile module, two of which shown as being engaged by a pair of identical connector biscuits 724(1) and 724(2), which are the same as or similar to connector biscuit 900 depicted in FIGS. 9A and 9B and described below. In the embodiment shown in FIG. 7B, each recessed receptacle 720(1) to 720(4) is essentially formed by a recess 728(1) to 728(4) in tile module 700, which can be formed by a notch in backing portion 704 along a corresponding peripheral edge of the tile module if the depth of the recess is equal to or greater than the thickness of the backing portion.

As seen in FIG. 7B, in this example each recessed receptacle 720(1) to 720(4) includes 16 planar electrical contacts 732 (only a few labeled to avoid clutter and only visible for receptacles 720(1) and 720(2)), and as seen in FIG. 7A, each connector biscuit 724(1) and 724(2) includes 16 corresponding electrical contacts 736 (only a few labeled to avoid clutter), here, of the leaf-spring type, that engage the 16 planar contacts when the connector biscuit is fully engaged with the corresponding recessed receptacle. Those skilled in the art will readily appreciate that any other suitable number of electrical contacts may be provided to front portion 708 and connector biscuits 724(1) and 724(2) in accordance with a particular design. It is noted that electrical contacts 732 need not be on front portion 708. For example, if the depth of each recessed receptacle 720(1) to 720(4) is less than the thickness of backing portion 704, then electrical contacts 732 may be provided on the backing portion. As another example, if tile module 700 were to have a construction different from the construction illustrated, such as by including another layer or other structure, electrical contacts 732 could be provided on such other layer or other structure. Electrical contacts 732 and the corresponding connector biscuits, such as connector biscuits 724(1) and 724(2), allow tile module 700 to communicate with another tile module (not shown, but see FIGS. 8A and 8B, or other component (not shown) of an overall architectural tiled panel system, such as a video controller, data source, and/or power source, among others. In the illustrated embodiment and as seen in FIG. 7B, each connector biscuit 724(1) and 724(2) includes a permanent magnet 740 for magnetically attracting that biscuit to a non-magnetized ferromagnetic support structure, such as the metal sheet or metal lattice mentioned above.

FIG. 7B also illustrates an exemplary arrangement of electrical connections, here, separate data connections 748 and power connections 752, that electrically connect together pertinent ones of electrical contacts 732 with recessed receptacles 720(1) to 720(4). Data and power connections 748 and 752 may be provided when tile module 700 is a non-sensory-output tile module that carries data and power that is ultimately passed to one or more sensory-output tile modules to cause such sensory-output tile(s) to function. In this example, data and power connections 748 and 752, respectively, are each four-way connections that, when any one of recessed receptacles 720(1) to 720(4) is receiving data or power, that power or data is present at each of the other three recessed receptacles. Those skilled in the art will readily understand that data and power connections 748 and 752 are represented diagrammatically in FIG. 7B and that the connections can be integrated within tile module 700 in any suitable manner. Those skilled in the art will also understand that data and power connections 748 and 752 illustrated are merely exemplary and that other arrangements are possible depending on, for example, the nature of the data and power signals to be handled by tile module 700 and the configurations of the overall data and power networks within an overall architectural tiled panel system in which the tile module will be used.

Figure 7C:
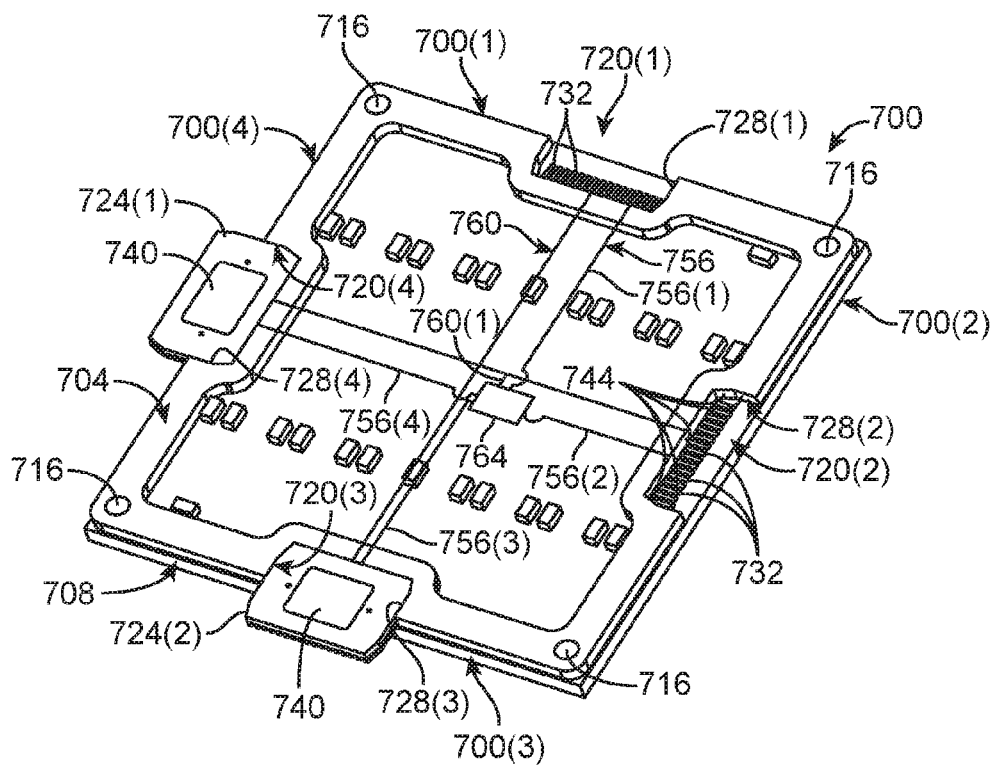
FIG. 7C is an enlarged isometric/diagrammatic view of the tile module of FIG. 1A, showing the rear face of the tile and the two connector biscuits engaged with the two recessed receptacles and diagrammatically illustrating an exemplary arrangement of data and power connections and electronics when the tile module is a sensory-output tile.

FIG. 7C shows many of the same components of tile module 700 shown in FIG. 7B, but shows exemplary data and power connections 756 and 760, respectively, for an embodiment in which the tile module is a sensory-output tile module. Similar to FIG. 7B, data and power connections 756 and 760 electrically connect together pertinent ones of electrical contacts 732 with recessed receptacles 720(1) to 720(4). However, in this example, tile module 700 also includes electronics 764 that control sensory-output functionality of the tile module, and data and power connections 756 and 760 are also in communication with these electronics to provide the data and power necessary for the electronics, and therefore tile module, to function. In this example, data and power connections 756 and 760, respectively, are each four-way connections that, when any one of recessed receptacles 720(1) to 720(4) is receiving data or power, that power or data is present at each of the other three recessed receptacles, as well as providing data and power to electronics 764. In this example, all data lines 756(1) to 756(4) of data connections 756 are connected with electronics 764, and power is provided to the electronics via a single power line 760(1). These arrangements can be different in different embodiments as needed. Those skilled in the art will understand that data and power connections 756 and 760 illustrated are merely exemplary and that other arrangements are possible depending on, for example, the nature of electronics 764, the nature of the data and power signals to be handled by tile module 700, and the configurations of the overall data and power networks within an overall architectural tiled panel system in which the tile module will be used. Those skilled in the art will also readily understand that data and power connections 756 and 760 are represented diagrammatically in FIG. 7C and that the connections can be integrated within tile module 700 in any suitable manner.

Figure 8A:
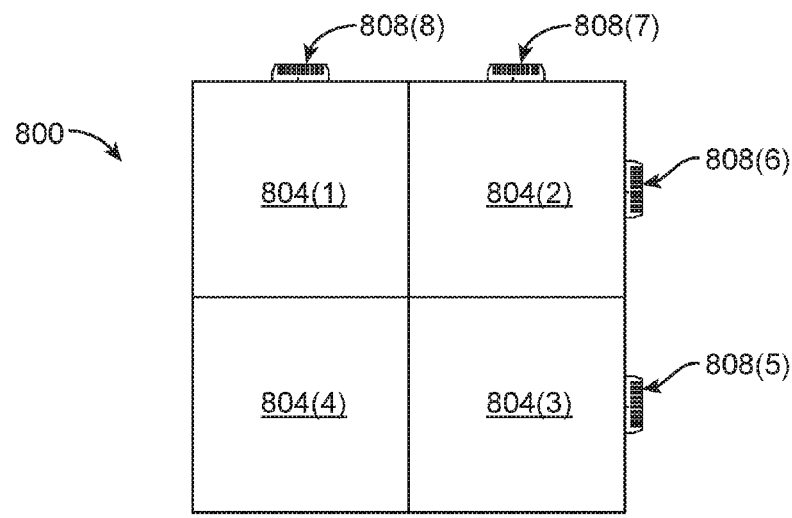
FIG. 8A is a front elevational view of an exemplary assembly of four tile modules operatively connected together via connector biscuits.
Figure 8B:
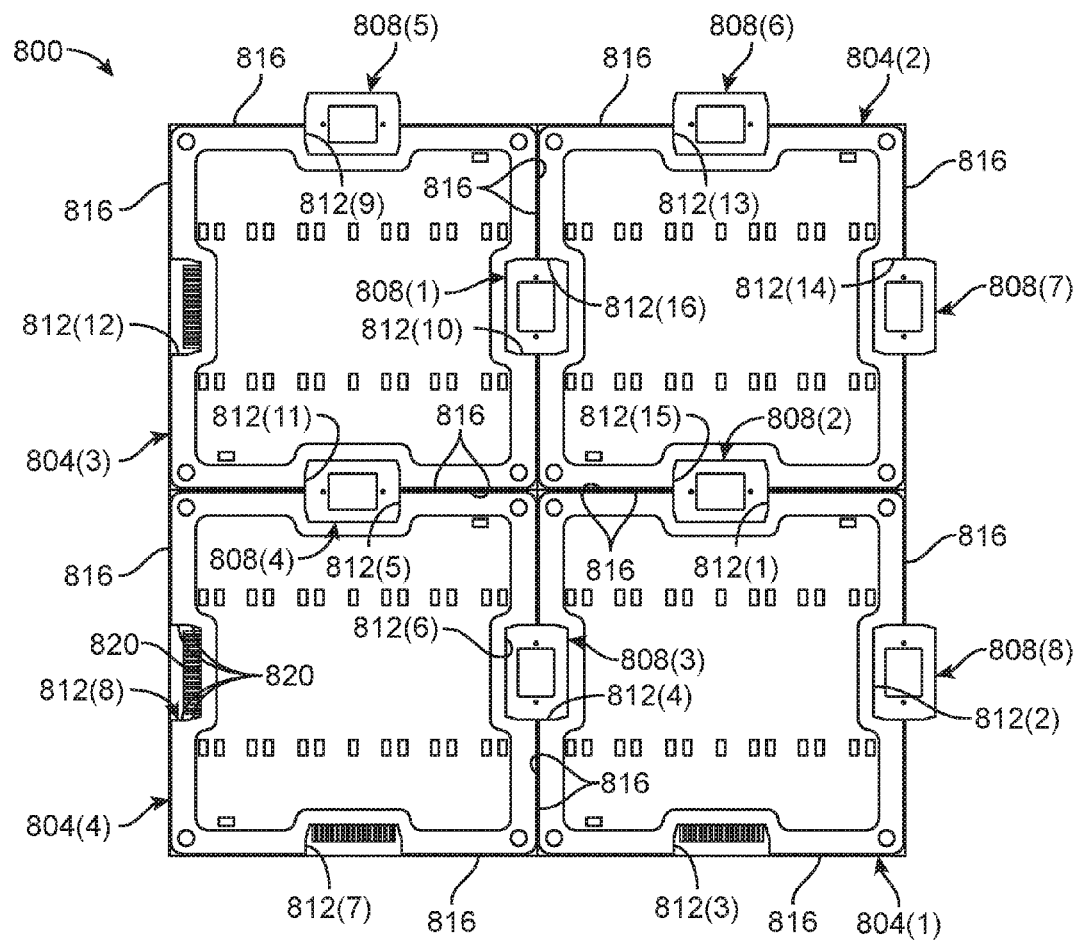
FIG. 8B is an enlarged rear-elevational view of the assembly of FIG. 2A, showing the four tile modules operatively connected together via four connector biscuits.

FIGS. 8A and 8B illustrate a portion 800 of a larger architectural tiled panel, composed of four tile modules 804(1) to 804(4), each of which may be physically identical or similar to tile module 700 of FIGS. 7A and 7B, electrically connected together via four connector biscuits 808(1) to 808(4) that are each identical to connector biscuits 724(1) and 724(2) shown in FIGS. 7A and 7B. In the example of FIGS. 8A and 8B, the sizes and shapes of connector biscuits 808(1) to 808(8) and recessed receptacles 812(1) to 812(16) may be carefully selected and formed to create very tight fits that minimize the amount of play between abutting tile modules, such as tile modules 804(1) to 804(4), particularly in a direction parallel to the abutting peripheral edges 816 (only a few labeled to avoid clutter). This allows the tile modules, such as tile modules 804(1) to 804(4), to be precisely aligned with one another, which can be critical for providing a high-quality composite display, where even small offsets can visually detract from the images displayed on the display, and/or for providing high-quality aesthetics with tight and well-aligned joints and corners. FIGS. 8A and 8B also show four additional connector biscuits 808(5) to 808(8) engaged with three of tile modules, here, tile modules 804(1), 804(2), and 804(3), each waiting to be operatively (here, electrically) connected to another tile module (not shown) or other component (not shown) of an overall architectural tiled panel system, such as a video controller, data source, and/or power source, among others. It is noted that while each tile module 804(1) to 804(4) is illustrated as having a single recessed receptacle 812(1) to 812(16) on each peripheral edge 816, as noted above, each peripheral edge may be provided with two or more recessed receptacles as needed to suit a particular design.

Figure 9A:
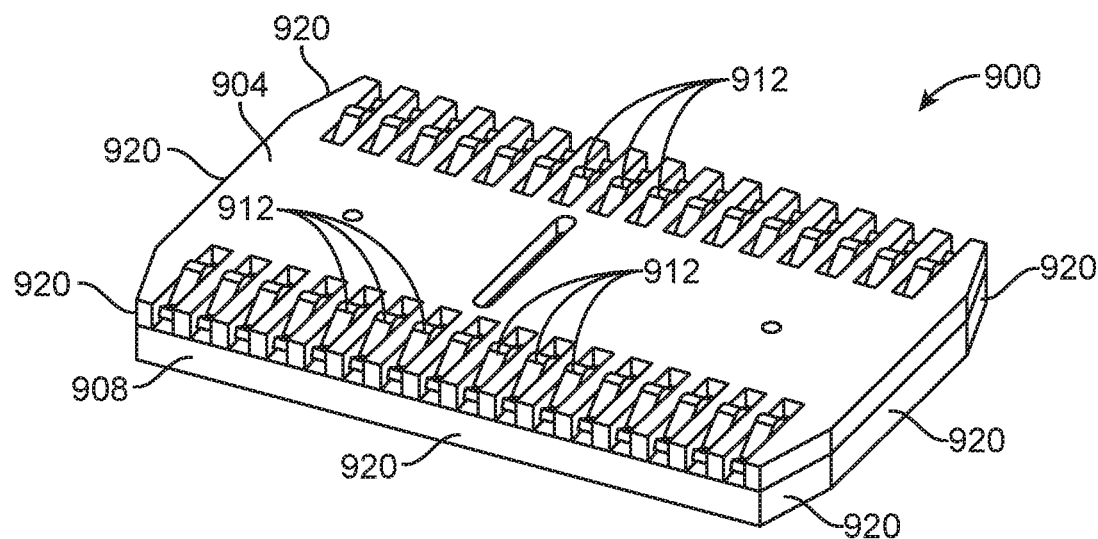
FIG. 9A is an isometric view of a connector biscuit that can be used as any of the connector biscuits of FIGS. 1A to 2B, showing its front face.
Figure 9B:
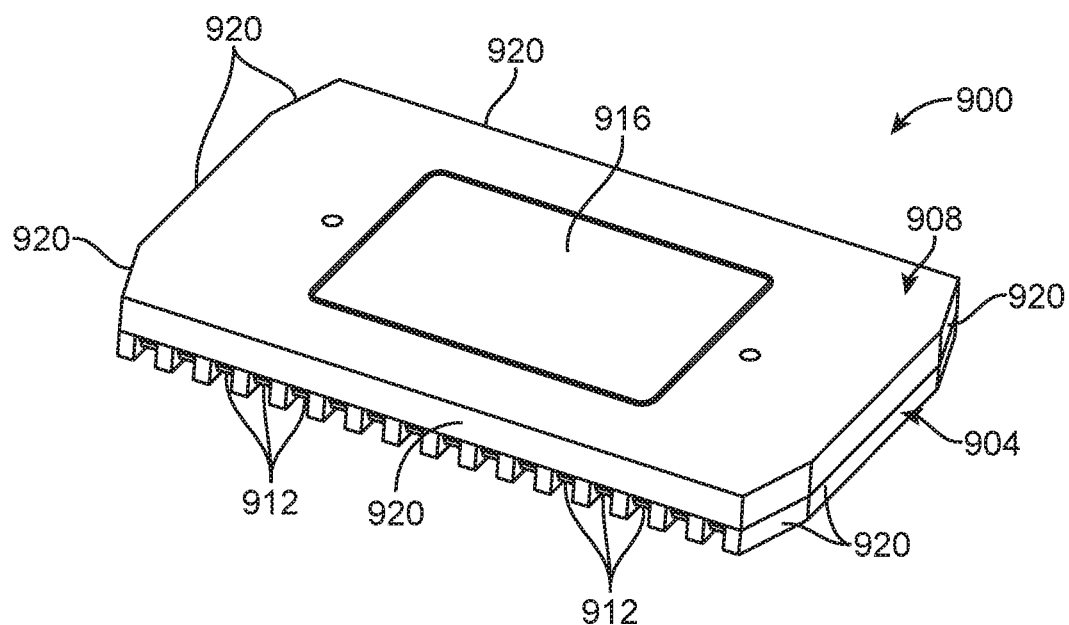
FIG. 9B is an isometric view of the connector biscuit of FIG. 3A, showing its rear face.

FIGS. 9A and 9B illustrate features of a connector biscuit 900 that is the same as or similar to each of connector biscuits 724(1) and 724(2) of FIGS. 7A and 7B and connector biscuits 808(1) to 808(8) of FIGS. 8A and 8B. As seen in FIG. 9A, in this embodiment connector biscuit 900 includes front and back housing components 904 and 908 secured together in a manner that sandwiches the electrical conductor(s) that provide the 16 leaf-spring-type electrical contacts 912 (only a few labeled to avoid clutter) on each end of the biscuit. As noted above, the overall size, shape, and configuration of connector biscuit 900 may be selected and formed to snugly engage corresponding recessed receptacles, such as recessed receptacles 720(1) to 720(4) of FIGS. 7A and 7B and recessed receptacles 812(1) to 812(16) of FIGS. 8A and 8B, on the tile modules at issue and, if desired, any additional components of an overall architectural tiled panel system of such modules. In some embodiments, each pair of corresponding electrical contacts 912 on opposing ends of connector biscuit 900 may be in electrical communication with one another but electrically insulated from each other pair of electrical contacts to provide 16 separate signal paths. In other embodiments, some or all of the 16 electrical contacts 912 on one end of connector biscuit 900 may be electrically connected in one or more groups to the 16 electrical contacts on the other end of the biscuit, depending on the design requirements of the overall architectural tiled panel system. In other embodiments, examples of which are described below in connection with FIG. 8, various ones or all of the interface points (e.g., electrical contacts 912) may be connected to one or more electronic components located onboard the connector biscuit, such as, but not limited to, microprocessor(s), signal processor(s), wireless communications device(s), among others, and any combination thereof. FIG. 9B illustrates this embodiment of connector biscuit 900 as including a magnet 916 secured to back housing component 908 that confronts a support structure (not shown) when the connector biscuit is deployed for use.

In the embodiment shown, connector biscuit 900 includes lateral surfaces, such as lateral surfaces 920, that are designed and configured to confront like surfaces within a recessed receptacle, such as like surfaces 744 and 820, of FIGS. 7B and 8B, respectively, with minimal or no gaps therebetween, so as to effect a precision fit between the connector biscuit and that electrical receptacle. In this manner and when used with abutting discrete tile modules, full engagement of the connector biscuit 900 with the mating receptacle can ensure proper edge alignment and/or gap between the tile modules connected together by the connector biscuit.

It is noted that while connector biscuit 900 is illustrated as having two housing components 904 and 908, in some embodiments it may have another construction, such as a monolithically molded construction or construction having more, fewer, and/or differing types of housing construction. In some embodiments, magnet 916 may be eliminated or replaced by another type of fastening means, such as an adhesive-based fastening means, hook-and-loop-based fastening means, or snap-fit mechanical connector, among others. Furthermore, in some embodiments, electrical contacts 912 may be replaced with another type of electrical contact, such as planar contacts, socket contacts, and pin contacts, among others, and/or may be provided in any suitable number, or may be replaced by another type of interface point, such as an optical interface point, an RF interface point, a microwave interface point, or magnetic interface point, among others. In addition, the specific shape of exemplary connector biscuit 900 is merely exemplary and non-limiting, as many other shapes are possible.

Figure 10:
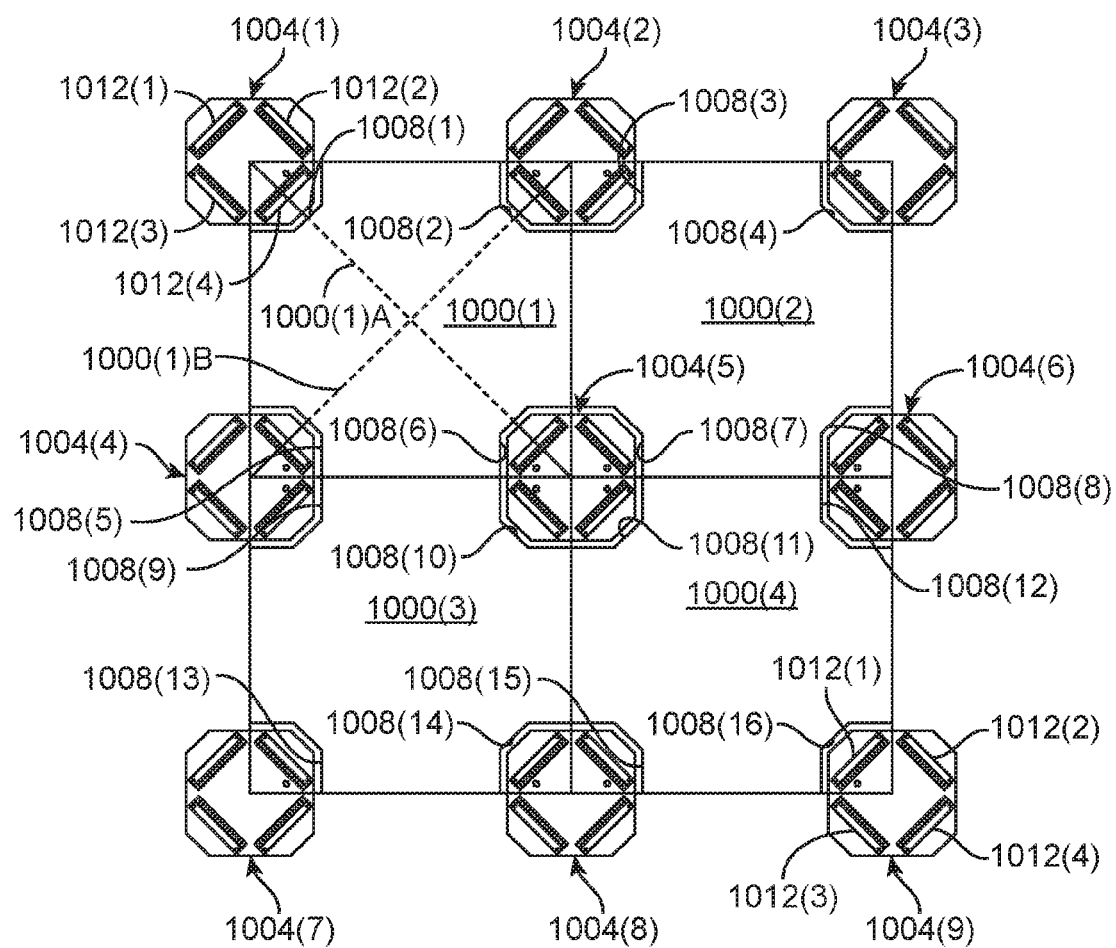
FIG. 10 is a front elevation/schematic diagram illustrating a portion of an architectural tiled panel system in which the tiles modules (illustrated as being translucent for sake of illustration) have alternative recessed receptacles located at their corners and designed and configured to engage corresponding rotationally symmetric connector biscuits.

FIG. 10 illustrates a configuration of corner-connected tile modules 1000(1) to 1000(4), in which the connector biscuits used to interconnect the tile modules, here connector biscuits 1004(1) to 1004(9), are rotationally symmetric about their centers of gravity. It is noted that each tile module 1000(1) to 1000(4) may be any type of sensory output tile module or non-sensory-output tile module suitable for the application at issue. Each tile modules 1000(1) to 1000(4) includes four recessed receptacles 1008(1) to 1008(16), each of which is physically symmetrical about a corresponding module diagonal, such as diagonals 1000(1)A and 1000(1)B of tile module 1000(1). In this example, connector biscuits 1004(1) to 1004(9) are identical to one another and each includes four interface points 1012(1) to 1012(4) (only some labeled for convenience) for interfacing with four tile modules (like tile modules 1000(1) to 1000(4)) or fewer than four tile modules. In this example, each interface point 1012(1) to 1012(4) includes a multi-contact electrical connector having 24 contact members for electrically contacting 24 matching contact members within each recessed receptacle 1008(1) to 1008(16). The electrical connectivity of interface points 1012(1) to 1012(4) depends on the design of tile modules 1000(1) to 1000(4) themselves as well as the overall architectural tiled panel system (not shown) of which they are part. Those skilled in the art will readily understand how to interconnect interface points 1012(1) to 1012(4) with one another according to the design parameters and/or how to connect the interface points with electronics (not shown), if any, such as in any of the manners described elsewhere herein.

The sort of construction illustrated in FIGS. 7A to 10 may be used for many types of architectural tiled panel systems of the present disclosure, including the architectural tiled panel systems of FIGS. 1 to 6B described in detail above.

Figure 11:
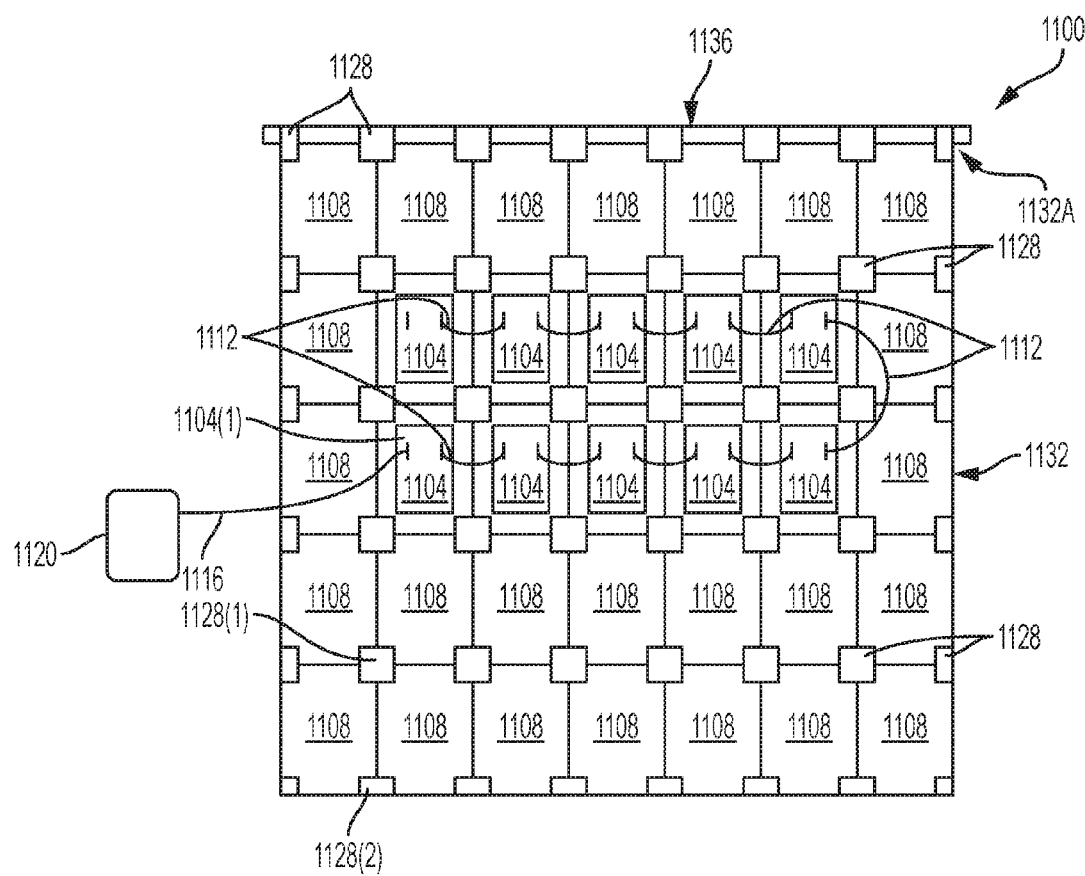
FIG. 11 is a rear elevational view of an exemplary architectural tiled panel system in which the sensory output tile modules are connected together via cables and the sensory output and non-sensory-output tile modules are directly coupled to one another.

FIG. 11 illustrates an exemplary simple architectural tiled panel system 1100 in which the sensory output tile modules 1104 and non-sensory-output tile modules 1108 are not electrically connected together via electrical connector biscuits as in other embodiments described above. In the example of FIG. 11, sensory output tile modules 1104 are video display modules that make up a mosaicked video display, and these modules are electrically connected together using cables 1112 that, in this case, daisy-chain the modules together. An additional cable 1116 connects the first sensory output tile module 1104(1) in the daisy chain to a video driver 1120. Other cabling schemes can be used as desired. Non-sensory-output tile modules in this example do not include electrical connectors; they simply provide aesthetically appealing presentation faces (not seen in FIG. 11).

Architectural tiled panel system 1100 also illustrates that sensory output tile modules 1104 and non-sensory-output tile modules 1108 can be secured to a base support (not shown) (e.g., wall of a building) and within the system in a manner other than by a sheet-type or frame-type support structure. In architectural tiled panel system 1100 of FIG. 11, tile modules 1104, 1108 are firmly coupled to one another via corner connectors 1128 that connect together adjacent ones of tile modules 1104, 1108 to form a unified composite panel 1132 and/or connect pertinent ones of the tile modules to a support, such as hanging-type support 1136. In the example illustrated, corner connectors 1128 are of two types: 4-corner connectors (e.g., corner connector 1128(1)) that connect together four tile modules 1104, 1108 and 2-corner connectors (e.g., corner connector 1128(2)) that connect together two tile modules along a free edge of unified composite panel 1132. It is noted that corner connectors 1128 that connect the upper row of tile modules 1108 to hanging-type support 1136 along upper end 1132A of unified composite panel 1132 may be the same as corner connectors 1128(1), 1128(2), or they may be different as needed to accommodate the manner in which the corner connectors engage the hanging-type support. In some embodiments, each connector 1128 may be a latch-catch type connector or pin-and-receiver type connector, among many others. Although unified composite panel 1132 is shown supported by hanging-type support 1136, it may be supported in another manner, such as by a support frame (not shown) having frame members extending vertically and/or horizontally and connecting to some or all of tile modules 1104, 1108, among other options. In some embodiments, each tile module 1104, 1108 can have one or more magnets for securing that module to a ferromagnetic support structure. Other means for securing some or all of tile modules 1104, 1108 to a support structure may be used.

Figure 12:
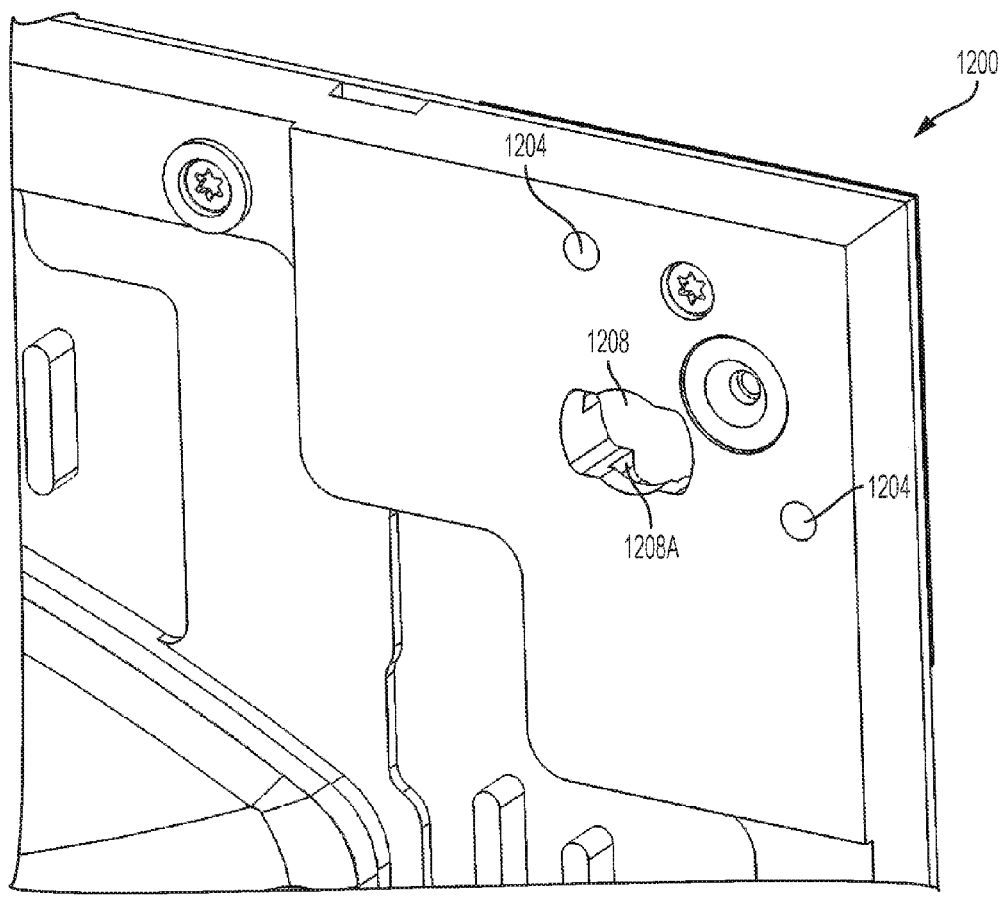
FIG. 12 is a partial isometric view of one corner of a sensory output tile module that may be used in a mosaicked video display panel as part of an architectural tiled panel system like that of FIG. 7, illustrating features for engaging a connector block for connecting the sensory output tile module directly to one, two, or three other tile modules and optionally indirectly to any number of other tile modules.

FIG. 12 illustrates a corner portion 1200 of a tile module, such as any one of tile modules 1104, 1108 of FIG. 11, showing features that may be present at one or more corners of two or more tile blocks for engaging a corresponding corner connector (not shown, but such as either of 4-corner and 2-corner connectors 1128(1) and 1128(2), respectively, of FIG. 11). These features include alignment receivers 1204 for snugly receiving corresponding alignment pins (not shown, but could be, for example, alignment pins that can be engaged in corresponding alignment receivers 1532 of 4-corner connector 1500 of FIG. 15C) and a keyhole 1208 for receiving a matching catch on a corner connector block (not shown). In the embodiment shown, keyhole 1208 is designed and configured to receive an oblong catch of a latch mechanism (see, e.g., catches 1520 of latch mechanisms 1508 of FIGS. 15A to 15C, with the catch insertable into the keyhole when the long direction of the catch is horizontal (relative to FIG. 12). Once the catch has been inserted into keyhole 1208, a user rotates the catch clockwise to cause the catch to have an interference fit within the keyhole. In the embodiment shown, keyhole 1208 includes rotation stops 1208A (only one seen in FIG. 12) that limits the clockwise rotation of the catch to 90° from its horizontal insertion orientation. In some embodiments, only alignment receivers 1204 or only keyholes like keyhole 1208 may be used in tile blocks, as desired. Depending on the configuration of construction of non-sensory-output tile modules (not shown) that will be used with a mosaicked video display panel, each non-sensory-output tile module may or may not include matching corner connector block engaging features.

Figure 13:
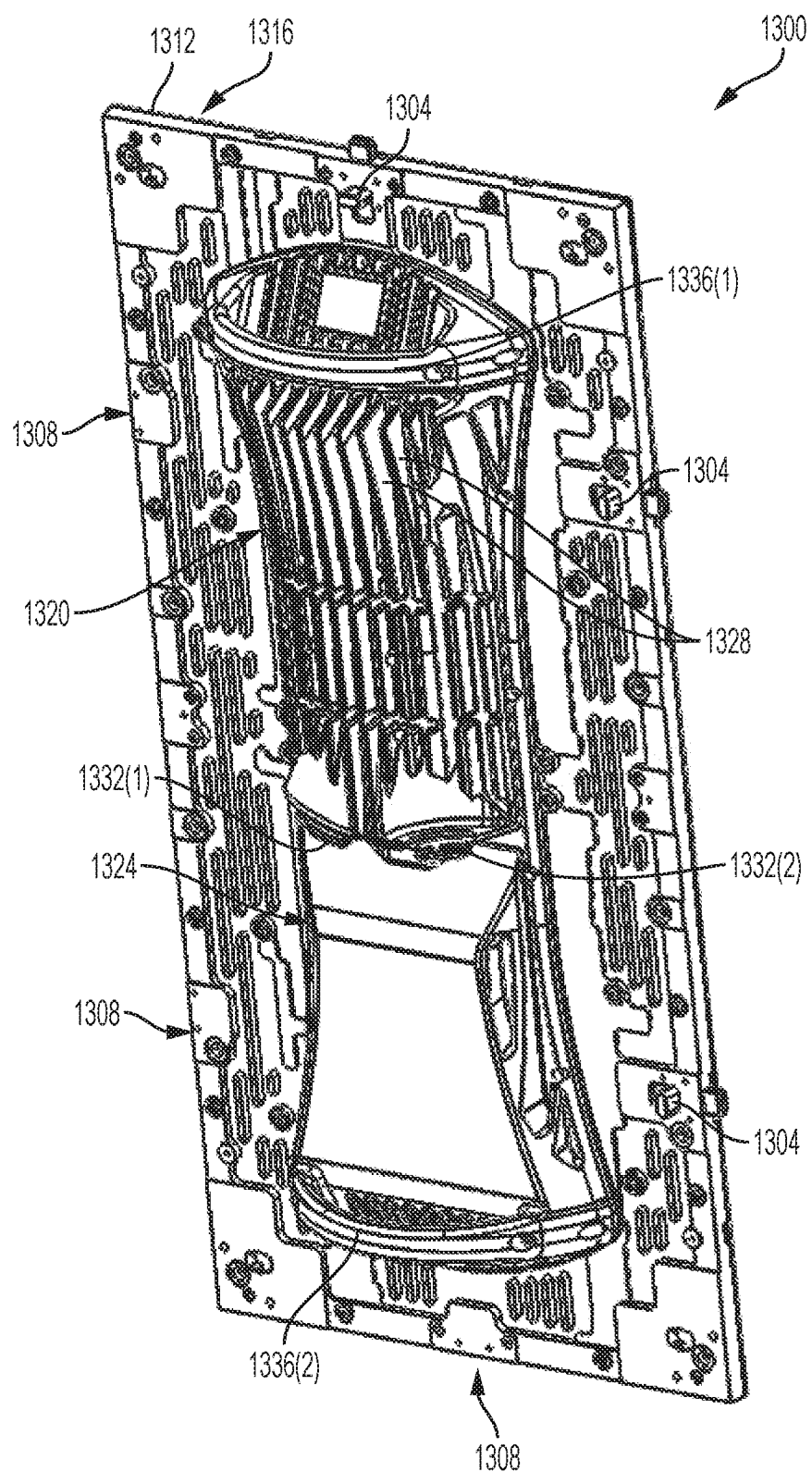
FIG. 13 is an isometric view of a sensory output tile module that may be used in a mosaicked video display panel as part of an architectural tiled panel system like that of FIG. 7, illustrating alignment pins and corresponding pin receivers for ensuring the presentation faces of abutting tile modules are flush with one another.

FIG. 13 illustrates an exemplary sensory output tile module, here a video display tile module 1300, which could be used for any one of sensory output tile modules 1104 of FIG. 11. In this example, sensory output tile module 1300 includes slidable alignment pins 1304 and complementary pin receivers 1308 that assist in ensuring that the presentation faces (not shown) of abutting tile modules are flush and properly aligned. In some embodiments, only slidable alignment pins 1304 or only pin receivers like pin receiver 1308 may be used in any particular tile module, as desired. Depending on the configuration of construction of any non-sensory-output tile modules (not shown, but see, e.g., non-sensory-output tile modules 1108 of FIG. 11) that may also be present, each non-sensory-output tile module may or may not include matching slidable alignment pins 1304 and pin receivers 1308.

The obverse side of video display tile module 1300 includes a video display 1312 that provides the tile module with a presentation face 1316. The reverse side of video display tile module 1300 includes housings 1320, 1324 that house electronics (not shown) that drive video display 1312. In the embodiment shown, housing 1320 includes heat-sinking fins 1328 (only a few labeled to avoid clutter) for sinking heat from electronics contained in the house to the surrounding environment. Housing 1320 also supports a pair of cable connectors 1332(1), 1332(2) for receiving corresponding respective cables (not shown, but see cables 1112 of FIG. 11) that carry data and power to and from video display tile module 1300. Video display tile module 1300 includes a pair of handles 1336(1), 1336(2) that allow a worker to easily manipulate and carry the tile module.

Figure 14:
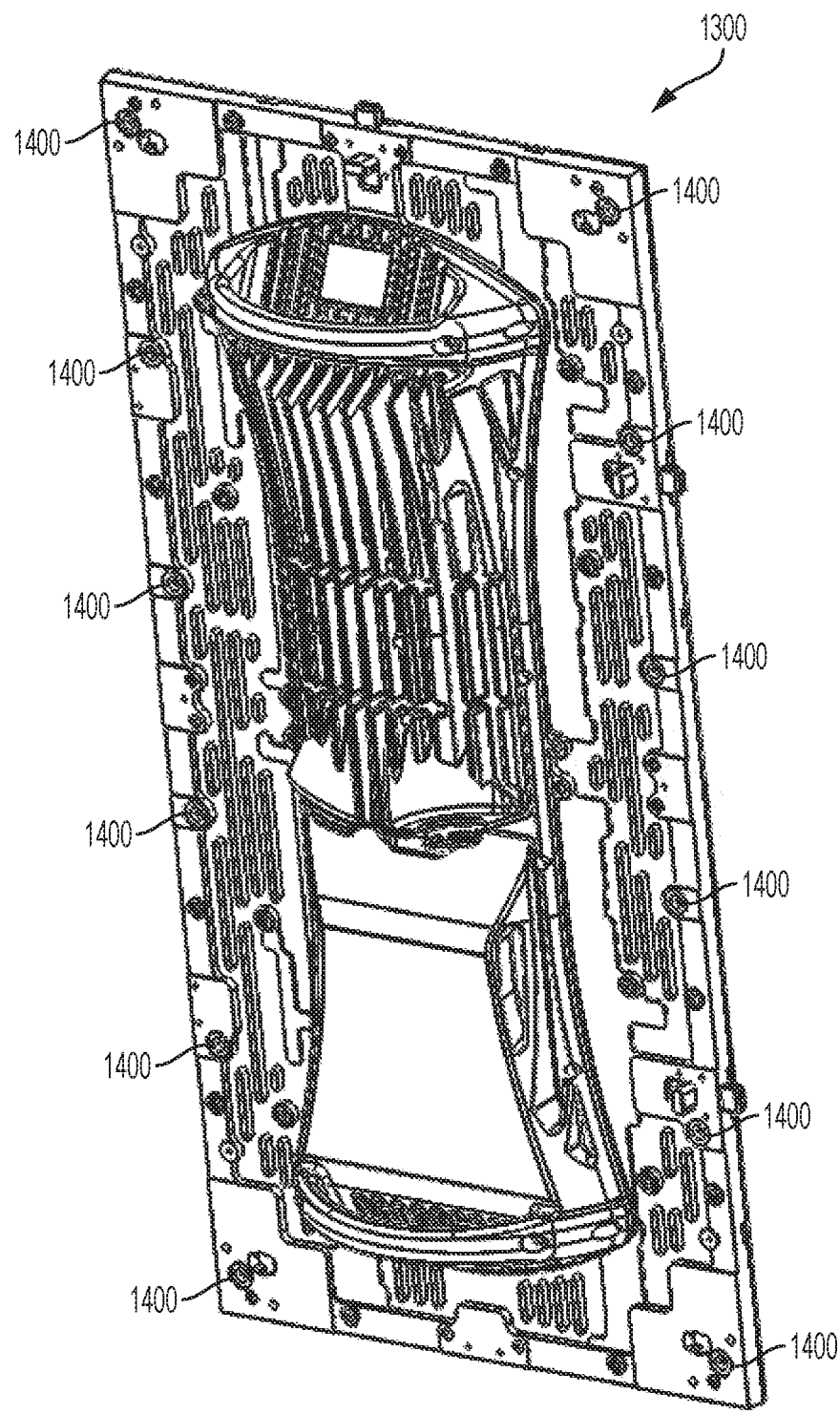
FIG. 14 is an isometric view of a sensory output tile module that may be used in a mosaicked video display as part of an architectural tiled panel system like that of FIG. 7, illustrating magnets that can be used to attach the tile module to a support structure that includes ferromagnetic material.

FIG. 14 illustrates that sensory output tile module 1300 may further include magnets 1400 that can be used as desired to attach the tile module to a support structure (not shown) that includes ferromagnetic material and/or other components, such as magnetized or magnetizable components, e.g., electromagnets, that can create or apply a magnetic field. Depending on the configuration of construction of any non-sensory-output tile modules (not shown, but see, e.g., non-sensory-output tile modules 1108 of FIG. 11) that may also be present, each non-sensory-output tile module may or may not include such magnets and/or other components or may include magnets in a different number and/or different arrangement.

FIGS. 15A-21 show details of an exemplary 4-corner connector 1500 that can be used for each 4-corner connector 1128(1) of FIG. 11, and illustrates how the 4-corner connector can be manipulated to securely connect individual tile modules, such as tile module 1300 of FIG. 13 and tile modules 1104, 1108 of FIG. 11, to one another and/or to a support, such as hanging-type support 1136 of FIG. 11. As shown in FIGS. 15A to 15C, 4-corner connector 1500 includes a base 1504 and four latch mechanisms 1508 engaged with corresponding respective latch-mechanism receivers 1512 formed in the base. As will be more fully understood after reading the below disclosure, each latch mechanism 1508 can be actuated by a corresponding rotatable and pivotable lever 1516, which allows a user to rotate, draw-tight, and lock a corresponding rotatable catch 1520 (FIGS. 15B and 15C) in place after being engaged with a corresponding keyhole, such as keyhole 1208 of FIG. 12. In FIGS. 15A and 15B, each lever 1516 is shown in its closed, or latched, position.

Figure 16:
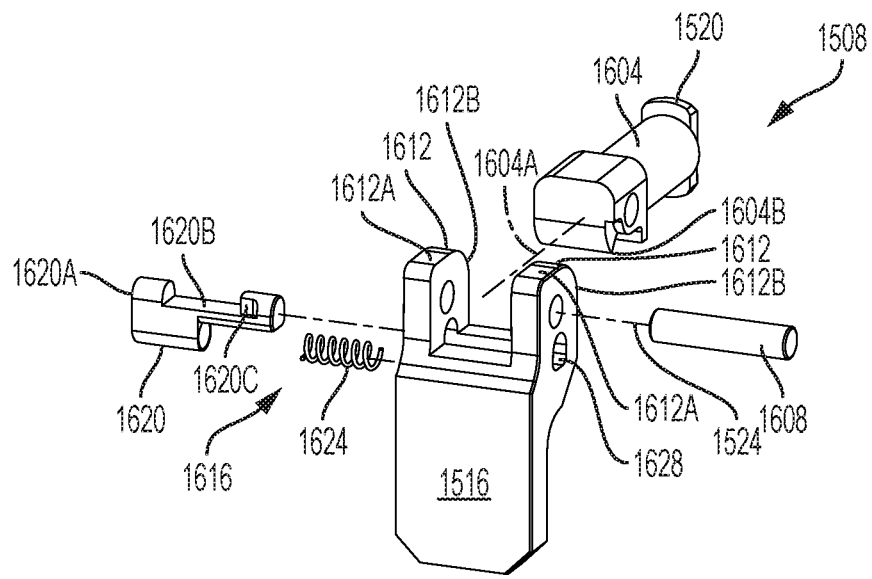
FIG. 16 is an enlarged exploded view of one of the latch mechanisms of FIGS. 15A to 15C.
Figure 18A:
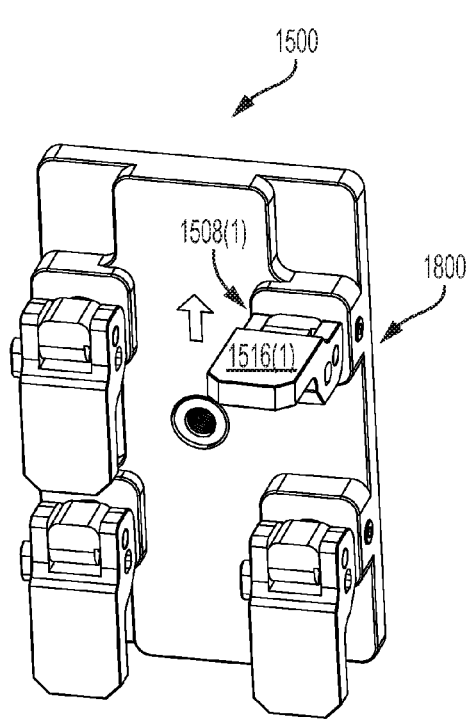
FIG. 18A is a perspective view of the obverse side of the 4-corner connector of FIGS. 15A to 15C, wherein one of the latch mechanisms is unlocked and unlatched.
Figure 18B:
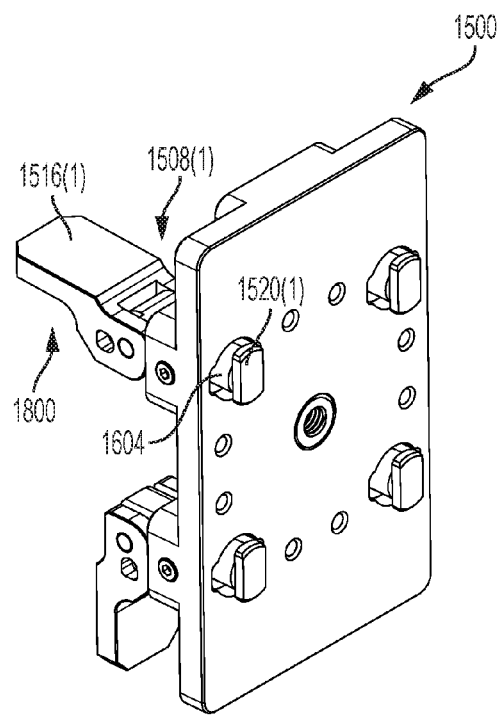
FIG. 18B is a perspective view of the reverse side of the 4-corner connector in the state of FIG. 18A.
Figure 19A:
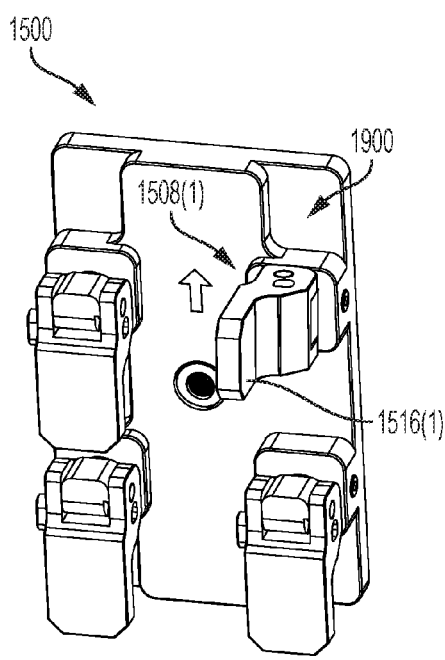
FIG. 19A is a perspective view of the obverse side of the 4-corner connector of FIGS. 15A to 15C, wherein the unlocked and unlatched latch mechanism of FIGS. 18A and 18B is rotated.
Figure 19B:
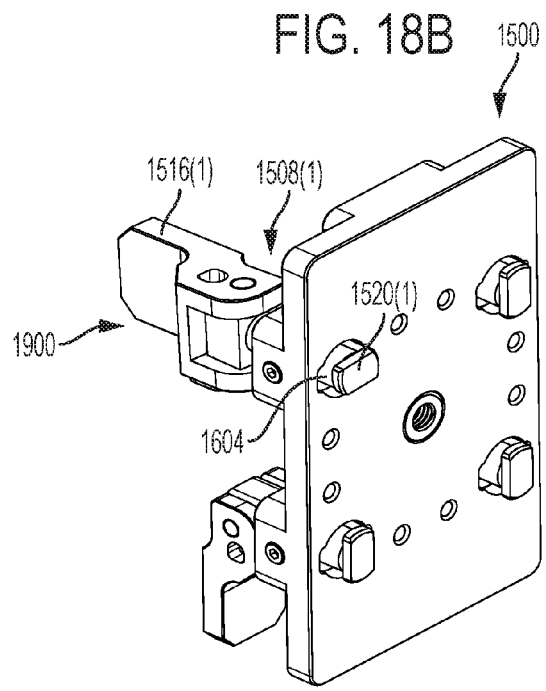
FIG. 19B is a perspective view of the reverse side of the 4-corner connector in the state of FIG. 19A.

As seen in FIG. 16, each latch mechanism 1508 includes a catch support 1604 having a first end to which catch 1520 is fixedly secured and a second end pivotably secured to lever 1516 via a pin 1608. Lever 1516 includes camming surfaces 1612 that, when latch mechanism 1508 is engaged within a latch-mechanism receiver 1512 and catch 1520 is lockingly engaged in a keyhole (not shown) of a tile module, allows a user to draw the tile module into tight engagement with base 1504 of 4-corner connector 1500 (FIGS. 15A-15C) by virtue of distance D1 in FIG. 15B between rotational axis 1524 of lever 1516 and portion 1612A of each camming surface 1612 being less than distance D2 between rotational axis 1524 and portion 1612B of each camming surface. As those skilled in the art will readily appreciate, distances D1 and D2 are carefully designed in conjunction with various dimensions of base 1504 and the corresponding keyholes (not shown) of the tile modules so that when portions 1612A of camming surfaces 1612 are engaged with surface 1504A of base 1504 with lever 1516 in an open, or unlatched, position (see lever 1516(1) of FIGS. 18A and 18B), a user can engage catch 1520 with a corresponding keyhole and easily rotate the catch within the keyhole by pivoting the lever while in its unlatched position. FIGS. 19A and 19B illustrate a rotational orientation 1900 of lever 1516(1) (relative to rotational axis 1604A (FIG. 16) of catch support 1604) corresponding to an orientation of catch 1520 in which the user can insert the catch into a corresponding keyhole or remove the catch therefrom. FIGS. 18A and 18B illustrate a rotational orientation 1800 of lever 1516(1) (relative to rotational axis 1604A (FIG. 16) of catch support 1604) corresponding to an orientation of catch 1520 in which the catch has an interference fit with the keyhole and the user can pivot the lever from its unlatched position (e.g., FIGS. 18A and 18B) to a closed position (e.g., FIG. 15B), with portions 1612B of camming surfaces 1612 engaging surface 1504A of base, thereby drawing the tile module or support (neither shown) into tight engagement with the backside 1504B of base 1504.

Figure 17A:
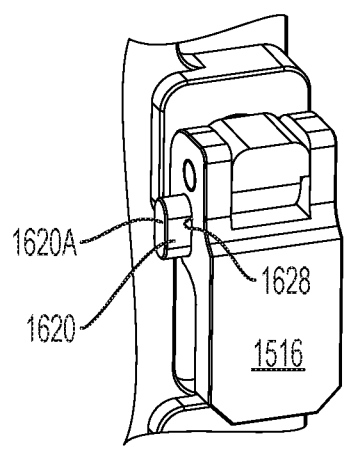
FIG. 17A is an enlarged perspective view of one of the latch mechanisms of the 4-corner connector of FIGS. 15A to 15C, showing the latch mechanism in a locked state.
Figure 17B:
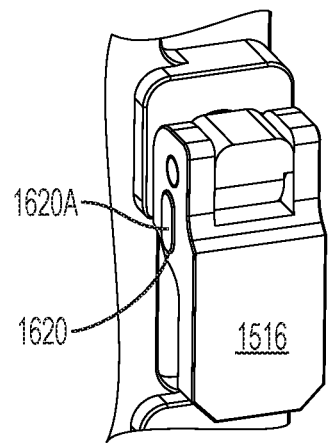
FIG. 17B is an enlarged perspective view of the latch mechanism of FIG. 17A, showing the latch mechanism in an unlocked state.

As also seen in FIG. 16, exemplary latch mechanism 1508 includes a locking mechanism 1616 that includes a lock member 1620 and a spring 1624, with the lock member and spring engaged in a suitably shaped receptacle 1628 in lever 1516 so that the lock member is slidable therein and the spring biases the lock member into a locked position. Lock member 1620 may be considered to have a button end 1620A. The locked position of lock member 1620 is illustrated in FIG. 17A, with button end 1620A extending from receptacle 1628, and the unlocked position of the lock member is illustrated in FIG. 17B, with the button end being more flush with the side of lever 1516. Referring again to FIG. 16, lock member 1620 has a notch 1620B located to allow a lock-member catch 1604B on catch support 1604 to pass through the lock member when its button end 1620A is depressed and to catch on the lock member at an interference portion 1620C when the lock member is biased so that the button end protrudes from receptacle 1628 and the lock member is in its locking position. When lock-member catch 1604B is engaged with interference portion 1620C of lock member 1620, lever 1516 is locked in its closed position.

FIG. 15C shows that a number of alignment receivers 1532 may be included on the backside of 4-corner connector 1500. Alignment receivers 1532 may correspond to alignment receivers 1204 of FIG. 12. In some embodiments, alignment receivers 1204 and/or alignment receivers 1532 may be provided with temporary (e.g., manually inserted) or permanently placed or replaced (e.g., with an adhesive, an interference fit, integrally formed, or otherwise) alignment pins (not shown) that facilitate proper alignment between 4-corner connector 1500 and the tile modules and/or one or more supports with which it is used.

Referring to FIGS. 15B and 15C, in this embodiment each latch mechanism 1500 has a corresponding retaining screw 1536 that may be used to provide interference to catch 1520 to prevent latch mechanism 1508 from latch-mechanism receiver 1512. In this connection, each latch-mechanism receiver 1512 has a transverse cross-sectional shape (FIG. 15C) having circular upper and lower portions for conformally and slidably confronting the cylindrical portion of catch-support 1604 (FIG. 16) and lateral channels that allow catch 1520 to pass through base 1504 when the catch is rotated so that its long axis is horizontal in FIG. 15C.

Figures 20A, 20B:
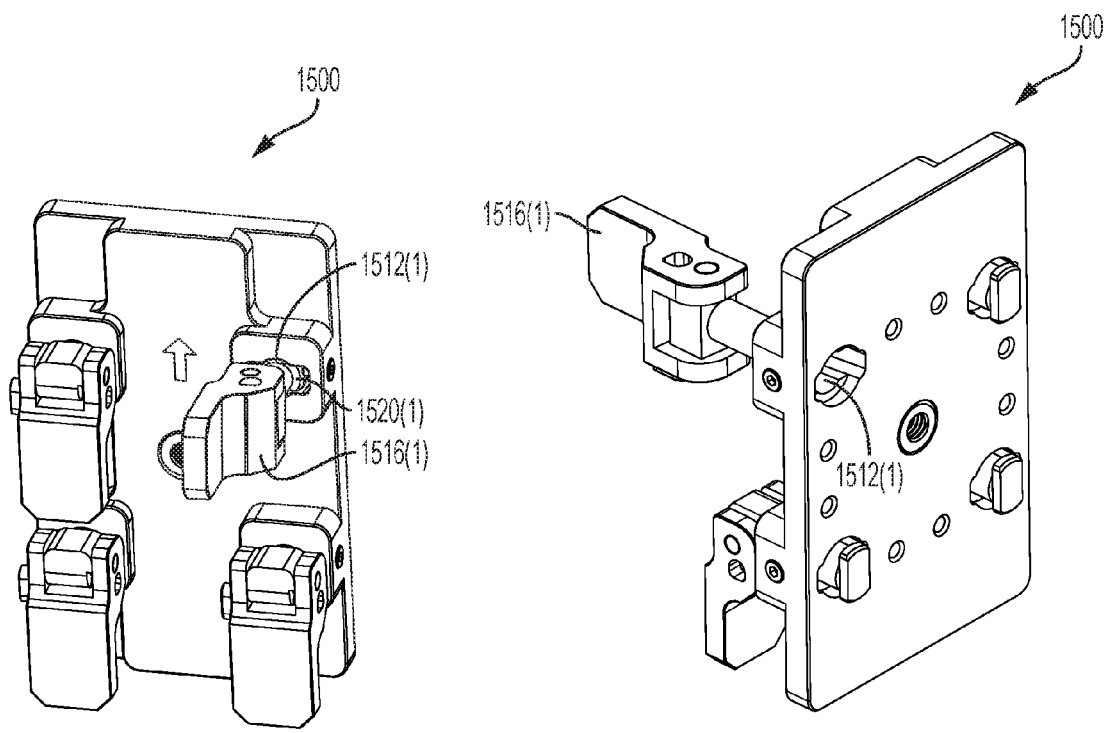
FIG. 20A is a perspective view of the obverse side of the 4-corner connector of FIGS. 15A to 15C, wherein the unlocked, unlatched, and rotated latch mechanism of FIGS. 19A and 19B is pulled back.
FIG. 20B is a perspective view of the reverse side of the 4-corner connector in the state of FIG. 20A.
Figure 21:
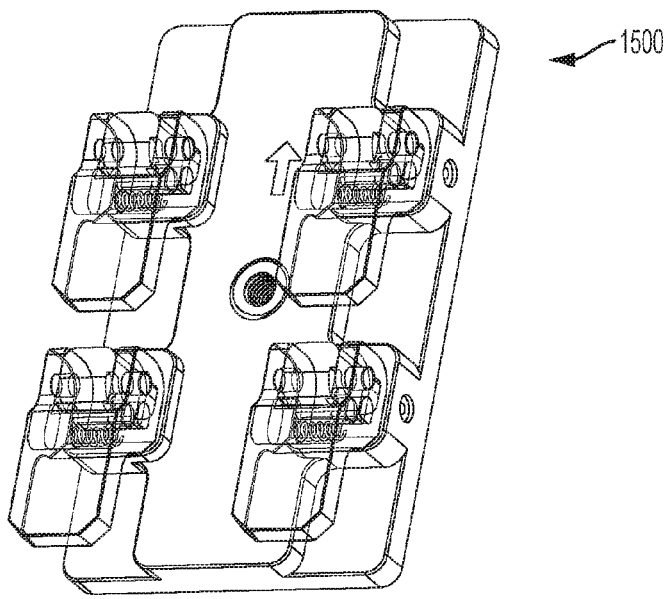
FIG. 21 is a perspective view of the 4-corner connector of FIGS. 15A to 15C with parts of the latch mechanisms shown in phantom to illustrate the arrangement of components shown in FIG. 16 when properly arranged in the latch.

FIGS. 18A to 20B illustrate various steps of a process of unlatching latch mechanism 1508(1) of 4-corner connector 1500 of FIGS. 15A to 15C from a tile module or support (neither shown). It will be readily appreciated that the same steps would need to be performed on all engaged and latched latch mechanisms 1508 of 4-corner connector 1500 in order to free the 4-corner connector from the tiles and/or support to which it is engaged. It will be readily appreciated that the order of these steps generally may be reversed in order to secure the 4-corner connector to a tile module or support. As shown in FIGS. 16, 17A, and 17B, latch mechanism 1508 includes a lock member 1620 having a button end 1620A. In order to disengage latch mechanism 1508(1), which is assumed to be engaged with and latched to a tile module or support, from the tile module or support, a user must first depress button end 1620A of lock member 1620 from its non-depressed, locked position (FIG. 17A) to a depressed, unlocked position (FIG. 17B). After the user has fully depressed lock button end 1620A of lock member 1620, lever 1516 of latch mechanism 1508 is unlocked, and the user may now unlatch the latch mechanism from the tile module or support by pivoting the lever away from base 1504 of 4-corner connector 1500 from the latched position shown in FIGS. 15A and 15B to the unlatched position shown in FIGS. 18A and 18B. Once unlocked and unlatched, the user may rotate latch mechanism 1508(1) by rotating lever 1516(1) counter-clockwise (although a clockwise rotation may be used in some embodiments) from rotational orientation 1800 of FIG. 18A to rotational orientation 1900 of FIG. 19A, which disengages catch 1520(1) from its interference fit with the corresponding keyhole (not show). After the user has rotated latch mechanism 1508(1) to rotational orientation 1900 of FIGS. 19A and 19B, although not strictly necessary, the user may also pull the latch mechanism away from the tile module or support by pulling on lever 1516(1), so as to retract catch 1520 into latch-mechanism receiver 1512(1) as illustrated in FIGS. 20A and 20B, for example, to facilitate easy removal of 4-corner connector 1500 from a tile module or support. As mentioned above, the steps illustrated and described in connection with FIGS. 18A to 20B generally can be reversed to engage latch mechanism 1508(1) to a tile module or support.

Figure 22:
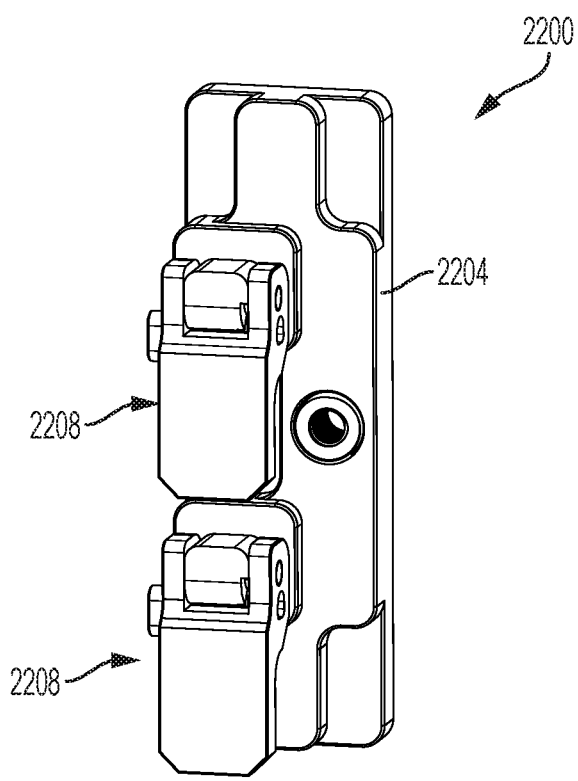
FIG. 22 is a perspective view of an exemplary 2-corner connector that can be used to securely connect a pair of abutting tile modules, such as the tile module shown in FIG. 13, to one another or to securely connect a tile module to a support.

FIG. 22 illustrates a 2-corner connector 2200 that may be used in place of a 4-corner connector, such as 4-corner connector 1500 of FIGS. 15A to 15C and is particularly useful when used along a free edge of an assembly of tile modules, such as unified composite panel 1132 of FIG. 11. While full 4-corner connectors are typically used where corners of four tile modules meet or where corners of two tile modules meet with one another and with a support, 2-corner connectors like 2-corner connector 2200 of FIG. 22, which includes a base 2204 and two latch mechanisms 2208, may be used along the side free edges and bottom free edge (see, e.g., FIG. 11) of a composite panel where only two corners of two tile modules meet or a single tile module meets a support, such as along the left- and right-hand free edges of unified composite panel 1132 of FIG. 11.

It is noted that each of the exemplary 4-corner and 2-corner connectors 1500 and 2200 of FIGS. 15A-15C and 22, respectively, provide mechanical connections only. However, in other embodiments, these and similar connectors can each be provided with electrical connectors, wiring/cabling, and/or other electrical components to carry data signals and/or power between/among tile modules that the connector is mechanically fastening together. For example, electrical features, for example, electrical contacts and wiring, of connector biscuits 724(1) and 724(2) of FIGS. 7A and 7B, connector biscuits 808(1) to 808(8) of FIGS. 8A and 8B, connector biscuit 900 of FIGS. 9A and 9B, and/or connector biscuits 1004(1) to 1004(9) of FIG. 10 can be incorporated into base 1504 of 4-corner connector 1500 of FIGS. 15A to 15C and/or into base 2204 of 2-corner connector 2200 of FIG. 22. As a particular example, those skilled in the art can readily envision rectangular tile modules having electrical interface points on its four corners in a manner similar to the electrical interface points at corner receptacles 1008(1) to 1008(16) of tile modules 1000(1) to 1000(4) of FIG. 10 and corresponding 4-corner connectors be configured in the manner of 4-corner connector 1500 of FIGS. 15A to 15C but with the electrical features of connector biscuits 1004(1) to 1004(9) of FIG. 10, such as interface points 1012(1) to 1012(4). Correspondingly, each tile module in this example would include a keyhole, similar to keyhole 1208 of FIG. 12, at each corner for engaging a corresponding latch mechanism, such as latch mechanism 1508 of 4-corner connector 1500 of FIGS. 15A to 15C. A 2-corner connector could be similarly modified. It is noted that alignment recesses on the tile modules and corner connectors, such as alignment recesses 1204 of tile module 1200 of FIG. 12 and alignment recesses 1532 of 4-corner connector 1500 of FIG. 15C, may be provided, or not. If provided, they themselves may function as electrical connectors, depending on the particular design.

It is noted that a connector similar to 4-corner connector 1500 of FIGS. 15A to 15C or 2-corner connector 2200 of FIG. 22 need not be used only at corners of a tile module. Rather, such or similar connectors can be used at non-corner locations. In addition, such non-corner connectors may include electrical components, for example, in the manner described immediately above. Those skilled in the art will be able to devise a variety of mechanical and mechanical-electrical connectors, without undue experimentation, using the present disclosure as a guide.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An architectural tiled panel system, comprising:
a support structure designed and configured to be secured to a base support;
a plurality of sensory output tile modules coupled to the support structure;
a plurality of non-sensory-output tile modules coupled to the support structure and located in abutting relation to ones of the plurality of sensory output tile modules so as to form a non-sensory-output surround for at least some of the plurality of sensory output tile modules; and
an electrical network electrically connecting the sensory output tile modules to at least one driver for driving the sensory output tile modules, wherein at least one of the non-sensory-output tile modules includes at least one pass-through electrical conductor that forms part of the electrical network;
wherein:
each of the plurality of sensory output tile modules and each of the plurality of non-sensory-output tile modules has a backside having a plurality of keyholes, the architectural tiled panel system further comprising a plurality of connectors each having at least two latch mechanisms designed and configured to matingly engage corresponding ones of the plurality of keyholes on a corresponding set of abutting tile modules of the plurality of sensory output tile modules and the plurality of non-sensory-output tile modules so as to firmly hold the set of abutting tile modules in fixed relation with one another; and
each of the plurality of connectors comprises a base and each of the at least two latch mechanisms is rotatably engaged with the base and includes:
a catch designed and configured to have an interference fit with a corresponding keyhole of the plurality of keyholes when properly rotated relative to the corresponding keyhole;
a catch-support member having first and second ends spaced from one another, the first end fixed to the catch; and
a lever rotatably engaged with the base and pivotably secured to the catch-support member at the second end, wherein the lever has a cam surface designed and configured to engage the base and to draw the catch toward the base as a user pivots the lever from a unlatched position to a latched position.

2. The architectural tiled panel system according to claim 1, wherein the non-sensory-output tile modules and the sensory output tile modules are electrically connected together via a plurality of electrical connector biscuits.

3. The architectural tiled panel system according to claim 2, wherein each of the sensory output tile modules and each of the non-sensory-output tile modules includes a set of recesses designed and configured to conformally engage a portion of one of the electrical connector biscuits.

4. The architectural tiled panel system according to claim 1, wherein the electrical network includes a plurality of electrical cables interconnecting the sensory output tile modules.

5. The architectural tiled panel system according to claim 1, wherein the non-sensory-output tile modules and the sensory output tile modules are directly coupled to one another to form a substantially rigid panel.

6. The architectural tiled panel system according to claim 1, wherein the support structure comprises a ferromagnetic material and each non-sensory-output tile module and each sensory output tile module includes at least one magnet for securing the non-sensory-output tile module or sensory output tile module to the support structure.

7. The architectural tiled panel system according to claim 1, wherein the support structure comprises a frame and a plurality of electrical connectors secured to the frame.

8. The architectural tiled panel system according to claim 7, wherein the plurality of electrical connectors are configured as pass-through connectors that pass power and/or driver signals between abutting ones of the sensory output tile modules and the non-sensory-output tile modules.

9. The architectural tiled panel system according to claim 7, wherein the frame comprises vertical and horizontal frame members and at least some of the vertical and horizontal frame members contain electrical conductors in electrical communication with ones of the plurality of electrical connectors.

10. The architectural tiled panel system according to claim 7, wherein the frame defines a plurality of tile module receivers.

11. The architectural tiled panel system according to claim 10, wherein the frame comprises a plurality of frame modules each including a subset of the plurality of tile module receivers.

12. The architectural tiled panel system according to claim 1, wherein each sensory output tile module has a presentation face and at least some of the non-sensory-output tile modules each have a presentation face larger than the presentation face of at least one of the sensory output tile modules.

13. The architectural tiled panel system according to claim 1, wherein the sensory output and non-sensory-output tile modules are coupled to one another to form a unified panel.

14. The architectural tiled panel system according to claim 13, wherein the unified panel has a top row of tile modules composed of ones of the non-sensory-output and/or sensory output tile modules, and the top row of tile modules is coupled to the support structure so as to suspend the unified panel from the support structure.

15. The architectural tiled panel system according to claim 13, wherein abutting ones of the sensory output and non-sensory-output tiles are rigidly secured to one another to form the unified panel.

16. The architectural tiled panel system according to claim 15, wherein each sensory output and non-sensory-output tile module includes a backside and a plurality of corners, the architectural tiled panel system further comprising a plurality of corner connector blocks securing abutting ones of the sensory output and non-sensory-output tile modules together at adjacent corners on the backsides.

17. The architectural tiled panel system according to claim 1, wherein each of the plurality of sensory output and non-sensory-output tile modules has a rectangular presentation face.

18. The architectural tiled panel system according to claim 17, wherein the presentation faces of the plurality of sensory output tile modules have a first size and the presentation faces of the plurality of non-sensory-output tile modules have a second size larger than the first size.

19. The architectural tiled panel system according to claim 1, wherein each of the at least two latch mechanisms includes a lock member having a locked position that inhibits a user from pivoting the lever from the latched position to the unlatched position.

20. The architectural tiled panel system according to claim 19, wherein the lock member is biased into the locked position by a spring.

21. The architectural tiled panel system according to claim 19, wherein the catch-support-member includes a lock-member catch and the lock member has a channel that allows the lock-member catch to pass when the lock member is in an unlocked position and has an interference portion that engages the lock-member catch when the lock member is in the locked position.

22. The architectural tiled panel system according to claim 20, wherein the lever includes a receptacle that slidably receives the lock member and that receives the spring, the lock member having a button end that extends from the lever when the lock member is in the locked position.

23. The architectural tiled panel system according to claim 1, further comprising alignment features on each of the base, each of the plurality of sensory output tile modules, and each of the plurality of non-sensory-output tile modules, wherein the alignment features are designed, configured, and located to align the base with corresponding respective ones of the plurality of sensory output tile modules and the plurality of non-sensory-output tile modules.

24. The architectural tiled panel system according to claim 1, wherein each of the plurality of sensory output tile modules and each of the plurality of non-sensory-output tile modules is rectangular and at least some of the plurality of connectors are 4-corner connectors designed and configured to connect together four abutting corners of four corresponding ones of the plurality of sensory output tile modules and each of the plurality of non-sensory-output tile modules.

25. The architectural tiled panel system according to claim 24, wherein at least some of the plurality of connectors are 2-corner connectors designed and configured to connect together two abutting corners of two corresponding ones of the plurality of sensory output tile modules and each of the plurality of non-sensory-output tile modules.

26. The architectural tiled panel system according to claim 1, wherein:
a first set of the plurality of the sensory output tile modules are video display modules arranged and connected into a composite video display panel; and
a first set of the plurality of the non-sensory-output tile modules are arranged around the composite video display panel so as to provide non-sensory-output surround for the composite video display panel.

27. The architectural tiled panel system according to claim 26, wherein at least one of the sensory output tile modules is an audio speaker module.

28. The architectural tiled panel system according to claim 26, further comprising a static graphic applied to the non-sensory-output surround.

* * * * *